(12) United States Patent
Ozaki et al.

(10) Patent No.: US 7,084,617 B2
(45) Date of Patent: Aug. 1, 2006

(54) ELECTRIC CURRENT SENSOR HAVING MAGNETIC GAP

(75) Inventors: Shinji Ozaki, Toyohashi (JP); Takashige Saitou, Ama-gun (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 11/094,153

(22) Filed: Mar. 31, 2005

(65) Prior Publication Data

US 2005/0237049 A1    Oct. 27, 2005

(30) Foreign Application Priority Data

Apr. 21, 2004  (JP) .............................. 2004-125355
Apr. 21, 2004  (JP) .............................. 2004-125356

(51) Int. Cl.
    *G01R 33/00*    (2006.01)

(52) U.S. Cl. ............................. 324/117 H; 324/117 R; 324/126; 324/127

(58) Field of Classification Search ............ 324/117 R, 324/117 H, 127, 126; 338/32 H; 327/511
See application file for complete search history.

(56) References Cited

U.S. PATENT DOCUMENTS

| RE31,613 | E | * | 6/1984 | Lienhard et al. ........ 324/117 R |
| 4,972,140 | A | * | 11/1990 | Okazaki et al. ......... 324/117 H |
| 5,552,700 | A | * | 9/1996 | Tanabe et al. .......... 324/117 H |
| 6,426,617 | B1 | | 7/2002 | Haensgen et al. |
| 6,512,359 | B1 | * | 1/2003 | Tamai et al. ............ 324/117 R |

FOREIGN PATENT DOCUMENTS

| GB | 2 252 419 A | 8/1992 |
| JP | A-2002-296305 | 10/2002 |

OTHER PUBLICATIONS

A Copy of an Office Communication issued by French Patent Office on Feb. 8, 2006.

* cited by examiner

*Primary Examiner*—Jermele Hollington
*Assistant Examiner*—Jimmy Nguyen
(74) *Attorney, Agent, or Firm*—Posz Law Group, PLC

(57) ABSTRACT

An electric current sensor includes: a core having a ring shape and including a plurality of core pieces, which are laminated and integrated to provide the core; a magnetic gap disposed on a predetermined part of the core; a Hall element disposed in the magnetic gap; a body for accommodating the core and the Hall element; and a seal member for sealing the core and the Hall element into the body. Each core piece has a thin plate shape, and the core includes deformation preventing means for preventing a deformation of the magnetic gap.

9 Claims, 27 Drawing Sheets

# ELECTRIC CURRENT SENSOR HAVING MAGNETIC GAP

CROSS REFERENCE TO RELATED APPLICATIONS

This application is based on Japanese Patent Application No. 2004-125355 filed on Apr. 21, 2004, and No. 2004-125356 filed on Apr. 21, 2004, the disclosures of which are incorporated herein by reference.

FIELD OF THE INVENTION

The present invention relates to an electric current sensor having a magnetic gap.

BACKGROUND OF THE INVENTION

An electric current sensor having the core of a ring shape, the magnetic gap formed by cutting and opening one portion of this core, and the Hall element arranged in this magnetic gap is conventionally known. The sensor is disclosed in, for example, Japanese Patent Application Publication No. 2002-296305. In this electric current sensor, the core and the Hall element are stored to a storing portion opened in the upper portion of a box body, and the interior of this storing portion is filled with a sealant of a synthetic resin material. The core and the Hall element are sealed by hardening this sealant.

In the electric current sensor, an electric current flowed to an electrically conductive member inserted into the core of the ring shape is detected by the Hall element arranged in the magnetic gap. Namely, a magnetic flux is generated within the core by the electric current flowed to the electrically conductive member, and the Hall element generates a voltage (Hall voltage) due to the Hall effect corresponding to this magnetic flux. The Hall voltage generated by the Hall element not only corresponds to the magnetic flux within the core, but also corresponds to the electric current flowed to the electrically conductive member generating this magnetic flux. Therefore, it is said that the Hall voltage is a detecting signal of this electric current value.

In this connection, for example, the electric current sensor is used to detect the electric current flowed to the electrically conductive member (bus bar) for connecting a car mounting battery of an automobile and a vehicle electric mounting article.

The core and the Hall element are first attached into the storing portion to manufacture the electric current sensor. Next, the interior of the storing portion is filled with liquid having fluidity or the sealant of a gel shape by flowing this liquid or the sealant into the storing portion or dropping (potting) the liquid or the sealant. Subsequently, the core and the Hall element are sealed and fixed within the storing portion in a state in which the core and the Hall element are positioned within the storing portion by hardening the sealant.

Here, the magnetic gap of the core is formed by cutting and opening one portion of the core. Therefore, stress generated by hardening the sealant is applied to the core, and the core of the ring shape is deformed, and the size shape of the magnetic gap is changed from a set value. Therefore, a problem exists in that accuracy and sensitivity of the electric current detection using the Hall element are reduced.

In particular, when the sealant having thermosetting property is used, large stress is generated at the thermosetting time of the sealant by a linear expansion coefficient of this sealant. Therefore, the core is easily deformed by this stress.

The sealant having small stress generated at the hardening time may be used to prevent the deformation of the core caused by hardening the sealant. However, since such a sealant is expensive, the problem of an increase in manufacture cost of the electric current sensor is caused.

SUMMARY OF THE INVENTION

In view of the above-described problem, it is an object of the present invention to provide an electric current sensor having a magnetic gap, which is hardly deformed.

An electric current sensor includes: a core having a ring shape and including a plurality of core pieces, which are laminated and integrated to provide the core; a magnetic gap disposed on a predetermined part of the core; a Hall element disposed in the magnetic gap; a body for accommodating the core and the Hall element; and a seal member for sealing the core and the Hall element into the body. Each core piece has a thin plate shape, and the core includes deformation preventing means for preventing a deformation of the magnetic gap.

The core and the Hall element are first attached into a storing portion to manufacture the electric current sensor. Next, an interior of the storing portion is filled with liquid having fluidity or a sealant of a gel shape by flowing the liquid or the sealant into the storing portion, or dropping the liquid or the sealant. Subsequently, the core and the Hall element are sealed and fixed into the storing portion in a state in which the core and the Hall element are positioned within the storing portion by hardening the sealant.

At this time, since the deformation preventing means is arranged in the core, the deformation of the magnetic gap is restrained by the deformation preventing means even when stress generated by hardening the sealant is applied to the core. Accordingly, no size shape of the magnetic gap is changed from a set value.

Accordingly, the deformation of the magnetic gap caused by hardening the sealant is prevented and reductions in accuracy and sensitivity of the electric current detection using the Hall element can be avoided by arranging the deformation preventing means in the core.

Any using material (e.g., various kinds of synthetic resin materials such as silicon, urethane, epoxy, etc.) may be used in the sealant if this using material is a nonmagnetic material having a preferable working property of the filling to the storing portion and able to reliably seal the core and the Hall element after the hardening.

In particular, when the sealant having thermosetting property is used, large stress is generated at the thermosetting time of the sealant by the linear expansion coefficient of this sealant. Therefore, the core is easily deformed by this stress. However, since the deformation of the magnetic gap can be prevented, the sealant having the thermosetting property can be used.

Accordingly, a limit with respect to the using material of the sealant is reduced, and the stress generated at the hardening time is large. Instead of this, a cheap seal material can be used. Therefore, manufacture cost of the electric current sensor can be reduced. Thus, the magnetic gap of the sensor is hardly deformed.

Preferably, the magnetic gap is provided by a notch, which is disposed on an inner portion of the core, and the deformation preventing means is a connection portion for connecting the core at the notch. Preferably, the magnetic gap is provided by a notch, which is disposed on an outer portion of the core, and the deformation preventing means is a connection portion for connecting the core at the notch.

In the electric current sensor, the connecting portion for connecting the core of at least one portion of the inside or the outside of the notch portion is arranged as the deformation preventing means. Therefore, even when the stress generated by hardening the sealant is applied to the core, the deformation of the notch portion is restrained by the connecting portion, and no size shape of the notch portion functioning as the magnetic gap is changed from a set value.

Further, a core cutting piece may be made by shearing and processing a hoop member as a thin plate material of a suitable electrically conductive magnetic material. The notch portion arranged in the core cutting piece and the connecting portion may be simultaneously formed in shearing and processing the core cutting piece from the hoop member.

Accordingly, it is not necessary to add a special manufacture process to form the notch portion and the connecting portion in the core cutting piece, and no manufacture cost of the core is increased by forming the notch portion and the connecting portion.

If the width of the connecting portion of the core is widely set, the operation and the effect can be raised. However, if the width of the connecting portion is widened, the magnetic flux density of a magnetic path formed in the notch portion is reduced. Therefore, there is a fear that the function as the magnetic gap of the notch portion is obstructed and the accuracy and sensitivity of the electric current detection using the Hall element are reduced.

Accordingly, the width of the connecting portion of the core is set by experimentally finding an optimum value by cut and try such that the operation and effect are sufficiently obtained and the accuracy and sensitivity of the electric current detection using the Hall element are further not reduced.

Preferably, the magnetic gap is provided by a through-hole, which is disposed on a middle portion of the core, and the deformation preventing means is a connection portion for connecting the core at the through-hole.

Preferably, the magnetic gap is provided by a slit, at which the core is separated. The deformation preventing means is an reinforcing member for connecting the core at the slit, and the deformation preventing member is disposed on an inner portion of the core. Preferably, the magnetic gap is provided by a slit, at which the core is separated. The deformation preventing means is a reinforcing member for connecting the core at the slit, and the deformation preventing member is disposed on an outer portion of the core. Preferably, the reinforcing member is adhered and fixed to the core.

In the above cases, the reinforcing member adhered and fixed to the core so as to connect at least a portion of the inside or the outside of the magnetic gap is arranged as the deformation preventing means. Therefore, even when stress generated by hardening the sealant is applied to the core, the deformation of the magnetic gap is restrained by the reinforcing member, and no size shape of the magnetic gap is changed from a set value.

Preferably, the magnetic gap is provided by a slit, at which the core is separated. The deformation preventing means is a regulating member, and the deformation preventing member is inserted in the gap without clearance in a case where the core is accommodated in the body.

In the above electric current sensor, the regulating member nipped in the magnetic gap without any clearance at the storing time of the core into the storing portion of the box body is arranged as a deformation preventing means. Therefore, the deformation of the magnetic gap is restrained by the regulating member even when stress generated by hardening the sealant is applied to the core. Accordingly, no size shape of the magnetic gap is changed from a set value.

Preferably, the deformation preventing means is inserted in the gap at an inner portion of the gap. More preferably, the deformation preventing means is inserted in the gap at an outer portion of the gap.

In the above electric current sensor, the deformation of the magnetic gap can be reliably prevented since the regulating member is nipped in at least a portion of the inside or the outside of the magnetic gap.

Preferably, the deformation preventing means is fully inserted in the gap so that the deformation preventing means surrounds the Hall element.

In the above electric current sensor, the regulating member is entirely nipped in the magnetic gap by surrounding the circumference of the Hall element. Therefore, the sensor in which the regulating member is nipped in one portion of the magnetic gap, the deformation of the magnetic gap can be more reliably restrained. Therefore, the above operation and effect can be further raised.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
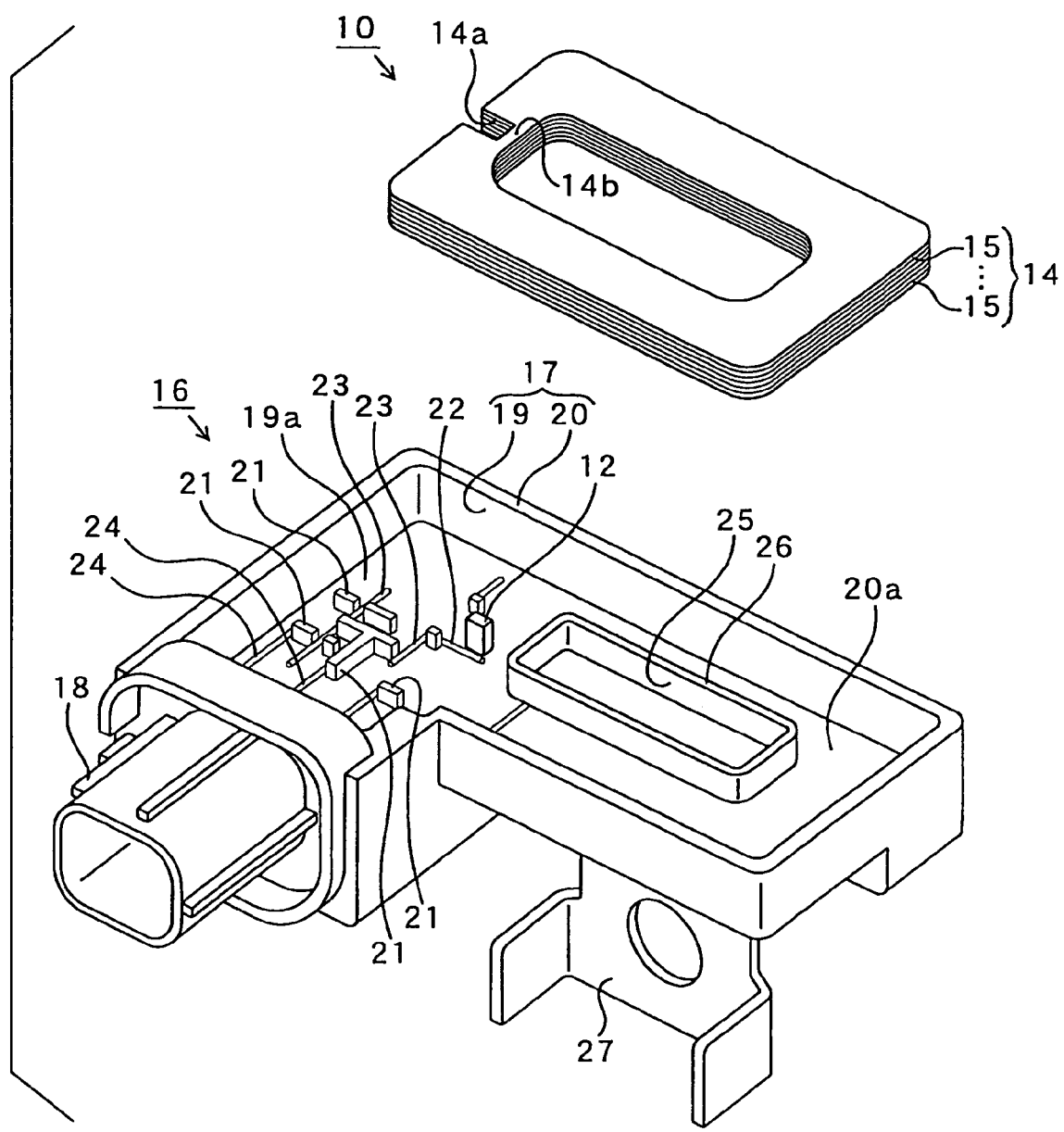
FIG. 1 is an exploded perspective view showing an electric current sensor according to a first embodiment of the present invention.

FIG. 1 is an exploded perspective view of a main portion for explaining the schematic construction of an electric current sensor 10 according to a first embodiment of the present invention.

Figure 2:
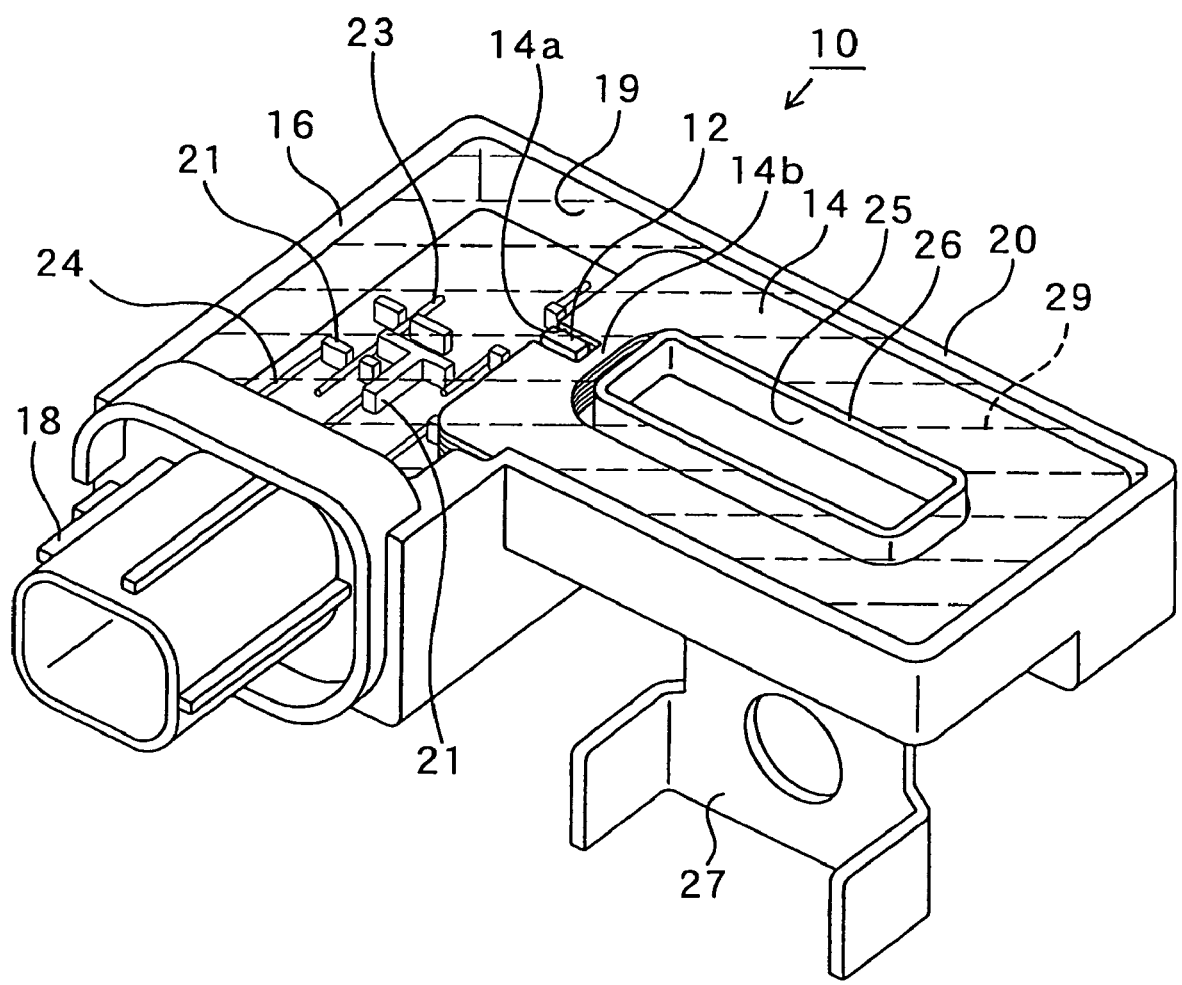
FIG. 2 is a perspective view showing the sensor according to the first embodiment.

FIG. 2 is a perspective view of the electric current sensor 10.

Figure 3:
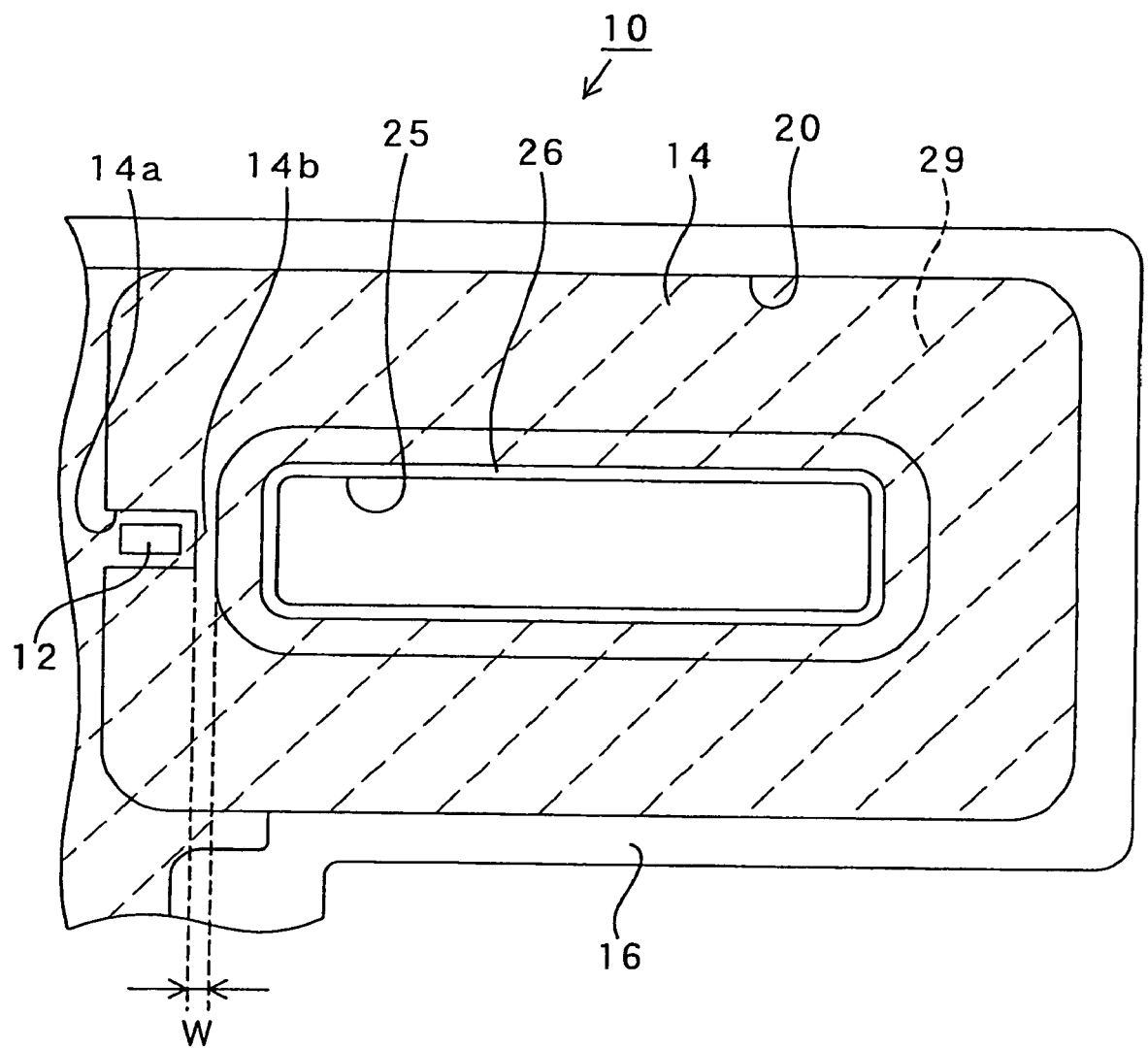
FIG. 3 is a partial plan view showing a main part of the sensor according to the first embodiment.

FIG. 3 is a plan view of a main portion of the electric current sensor 10.

The electric current sensor 10 is constructed by a Hall element 12, a core 14 (a core cutting piece 15, a notch portion 14a and a connecting portion 14b), a box body 16 (a storing portion 17, a connector mounting portion 18, a circuit storing portion 19, a core storing portion 20, an insertion hole 25 and an outer circumferential wall 26), an electronic part 21, wiring members 22 to 24, an attachment fitting 27, a sealant 29, etc.

The connecting portion 14b corresponds to deformation preventing means.

The core 14 is formed by laminating and integrating plural core cutting pieces 15 of a thin plate shape. The core cutting piece 15 is formed by shearing-processing (press working) a suitable electrically conductive magnetic material (e.g., iron, an iron-based alloy, permalloy, etc.).

The core 14 (i.e., the core cutting piece 15) has a ring shape approximately formed in a rectangular shape in which round portions are formed at four corners. The outside portion of one portion (one portion on the short side of the approximately rectangular shape in the illustrated example) of this ring shape is notched in a concave shape toward the inside so that the notch portion 14a is formed. The connecting portion 14b is formed by connecting the core 14 inside this notch portion 14a. The notch portion 14a functions as a magnetic gap of the core 14.

In the box body 16 of a nonmagnetic material manufactured by synthetic resin, the storing portion 17 opened upward, and the connector mounting portion 18 of a sleeve shape opened on the side are integrally formed by injection molding.

The storing portion 17 is constructed by connecting the circuit storing portion 19 approximately formed in a box shape, and the core storing portion 20 approximately formed in a double frame shape.

Here, the circuit storing portion 19 is formed in a shape shallower than that of the core storing portion 20. The bottom face 19a of the circuit storing portion 19 is arranged in a position higher than that of the bottom face 20a of the core storing portion 20. The box body 16 is formed by a structure of a stepwise shape of two stages constructed by high and low stages.

The connector mounting portion 18 is connected to the side of the circuit storing portion 19. The box body 16 is approximately formed in an L-shape as a whole.

The Hall element 12 is attached and fixed to the bottom face 19a of the circuit storing portion 19. Further, plural electronic parts 21 of various kinds constituting a drive control circuit of the Hall element 12 are attached and fixed to the bottom face 19a. An adhesive is used to connect and fix the Hall element 12 and each electronic part 21.

The Hall element 12 and each electronic part 21 are connected through the wiring member 22, and each electronic part 21 is connected through the wiring member 23. Further, an unillustrated connector terminal arranged within the connector mounting portion 18 and each electronic part 21 are connected through the wiring member 24. Electric welding is used instead of soldering in the connection of the respective wiring members 22 to 24.

The insertion hole 25 of a rectangular shape for inserting an electrically conductive member described later is opened approximately at the center of the bottom face 20a of the core storing portion 20. The height of the outer circumferential wall 26 of the insertion hole 25 is set so as to be equal to the height of the outer circumferential wall of the storing portion 17 (the circuit storing portion 19 and the core storing portion 20).

The attachment fitting 27 is attached and fixed to the rear face side of the bottom face 20a of the core storing portion 20. A through hole is formed in the attachment fitting 27. The electric current sensor 10 can be attached and fixed to a fixing object (e.g., a member within the engine room of an automobile) by inserting a bolt into this through hole and screwing the bolt to the fixing object.

The core 14 is stored into the storing portion 17. Namely, the core 14 is fitted to the outer circumferential wall 26 of the insertion hole 25 within the core storing portion 20. The core 14 is placed on the bottom face 20a of the core storing portion 20 such that the core 14 of the ring shape surrounds the insertion hole 25.

A short side portion of the core 14 having the notch portion 14a is projected into the circuit storing portion 19. The Hall element 12 is arranged by forming a gap approximately in the central position of the notch portion 14a functioning as a magnetic gap so as not to come in contact with the core 14. For example, the distance of the notch portion 14a is set to 2.5 mm, and the width of the Hall element 12 is set to 1.5 mm, and the gap between the Hall element 12 and the core 14 is set to 0.5 mm.

The interior of the storing portion 17 is filled with the sealant 29 (a slanting line hatching portion shown in FIGS. 2 and 3). A storing object (the Hall element 12, the core 14, the electronic part 21 and the wiring members 22 to 24) of the storing portion 17 is sealed by hardening the sealant 29. The position relation of this storing object within the storing portion 17 is positioned and fixed.

An unillustrated electrically conductive member of a detecting object is first inserted into the insertion hole 25 to use the electric current sensor 10 constructed in this way. Next, an unillustrated connector of an external device for inputting a detecting signal of the electric current sensor 10 is inserted into the connector mounting portion 18. The external device and the unillustrated connector terminal within the connector mounting portion 18 are then connected.

When an electric current is flowed to the electrically conductive member, a magnetic flux is generated within the core 14 by this electric current. The Hall element 12 arranged within a magnetic path formed in the notch portion 14a by this magnetic flux generates a voltage (Hall voltage) by the Hall effect corresponding to this magnetic flux.

Here, the Hall voltage generated by the Hall element 12 not only corresponds to the magnetic flux within the core 14, but also corresponds to the value of an electric current flowed to the electrically conductive member generating this magnetic flux. Therefore, it is said that the Hall voltage is a detecting signal of this electric current value. Therefore, the Hall voltage generated by the Hall element 12 is outputted to the above external device as the detecting signal.

Accordingly, the electric current sensor 10 can detect the value of the electric current flowed to the electrically conductive member inserted into the core 14 of the ring shape by the Hall element 12 arranged in the notch portion 14a of the core 14.

In this connection, for example, the electric current sensor 10 is used to detect the value of the electric current flowed to the electrically conductive member (bus bar) for connecting a car mounting battery of an automobile and a vehicle electric mounting article.

[Operation and Effect]

In accordance with the sensor according to the first embodiment, the following operation and effect can be obtained.

[1-1] A storing object (the Hall element 12, the core 14, the electronic part 21 and the wiring members 22 to 24) is first attached into the storing portion 17 so as to manufacture the electric current sensor 10. Next, the interior of the storing portion 17 is filled with liquid having fluidity or the sealant 29 of a gel shape by flowing the liquid or the sealant 29 into the storing portion 17, or dropping (potting) the liquid or the sealant 29. Subsequently, the above storing object is sealed and fixed into the storing portion 17 in a state in which the above storing object is positioned within the storing portion 17 by hardening the sealant 29.

At this time, the core 14 is connected by the connecting portion 14b inside the notch portion 14a of the core 14. Therefore, even when stress generated by hardening the sealant 29 is applied to the core 14, deformation of the notch portion 14a is restrained by the connecting portion 14b and no size shape of the notch portion 14a functioning as a magnetic gap of the core 14 is changed from a set value.

Accordingly, the deformation of the notch portion 14a caused by hardening the sealant 29 is prevented and reductions in accuracy and sensitivity of the electric current detection using the Hall element 12 can be avoided by arranging the connecting portion 14b in the core 14.

[1-2] Any using material (e.g., various kinds of synthetic resin materials such as silicon, urethane, epoxy, etc.) may be used in the sealant 29 if this using material is a nonmagnetic material having a preferable working property of the filling to the storing portion 17 and able to reliably seal the storing object (the Hall element 12, the core 14, the electronic part 21 and the wiring members 22 to 24) of the storing portion 17 after the hardening.

In particular, when the sealant 29 having thermosetting property is used, large stress is generated by the linear expansion coefficient of this sealant 29 at the thermosetting time of the sealant 29. Therefore, the core 14 is easily deformed by this stress. However, in the sensor according to the first embodiment, since the deformation of the notch portion 14a of the core 14 can be prevented, the sealant 29 having the thermosetting property can be used.

Accordingly, in the sensor according to the first embodiment, a limit with respect to the using material of the sealant 29 is reduced, and the stress generated at the hardening time is large. Instead of this, a cheap sealing material can be used. Therefore, manufacture cost of the electric current sensor 10 can be reduced.

Figure 4:
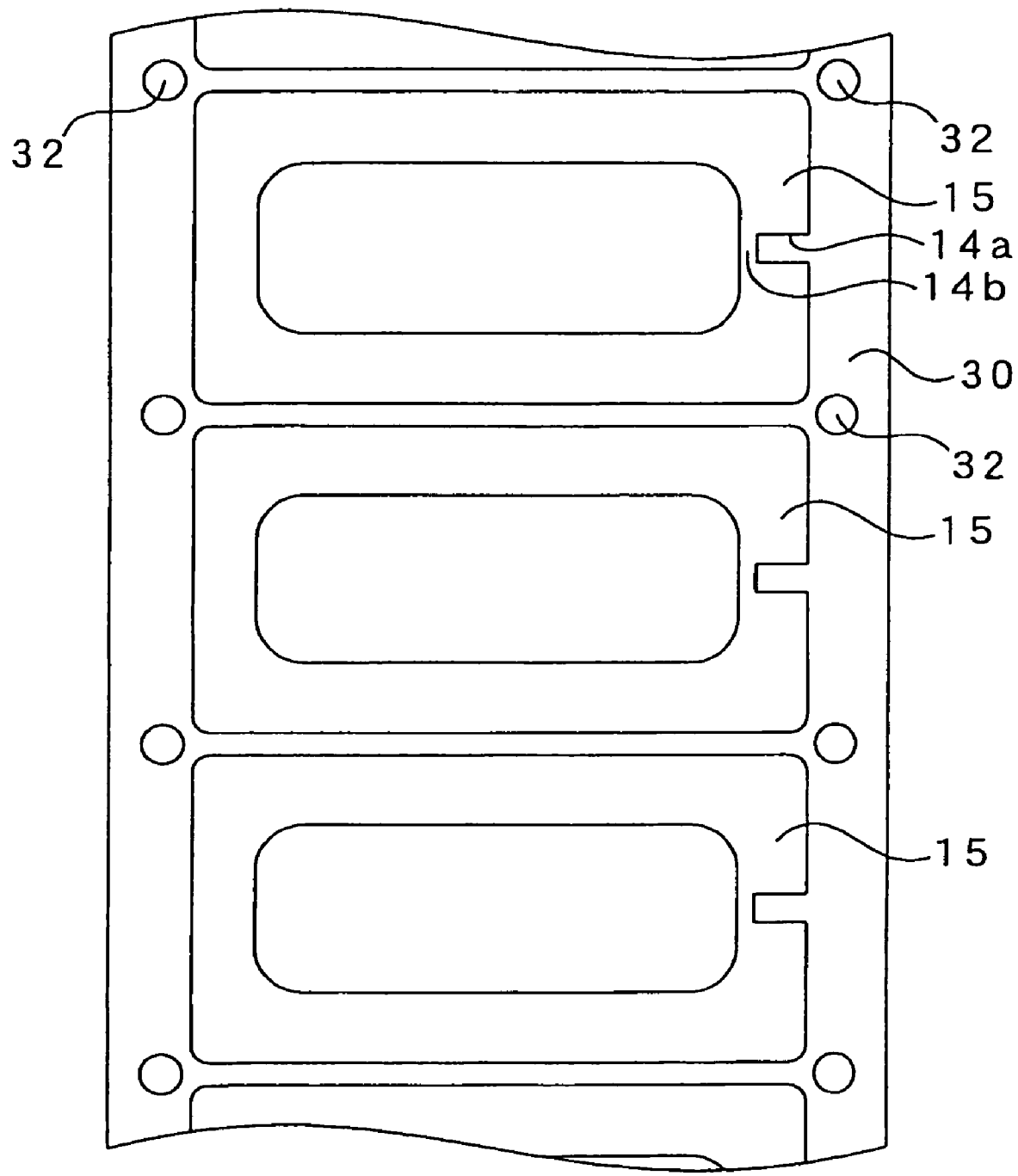
FIG. 4 is a partial plan view showing a hoop member of the sensor according to the first embodiment.

[1-3] FIG. 4 is a plan view of a hoop member 30 for forming the core cutting-piece 15 constituting the core 14.

The hoop member 30 is a long thin plate material formed by the above magnetic material. Plural core cutting pieces 15 are punched and made from the hoop member 30 by shearing-processing (press working) this hoop member 30 using a shearing process machine (press process machine).

Plural guide holes 32 arranged in the longitudinal direction are formed so as to extend through the hoop member 30. Each guide hole 32 functions as a perforation for feeding the hoop member 30 to the shearing process machine and positioning the hoop member 30.

Here, the notch portion 14a and the connecting portion 14b arranged in the core cutting piece 15 are simultaneously formed in shearing-processing the core cutting piece 15 from the hoop member 30.

Accordingly, it is not necessary to add a special manufacture process to form the notch portion 14a and the connecting portion 14b in the core cutting piece 15, and no manufacture cost of the core 14 is increased by forming each of the notch portion 14a and the connecting portion 14b.

It is also considered that the connecting portion 14b is made by a member separated from the core 14 (core cutting piece 15), and the magnetic gap is formed by cutting and opening one portion of the ring shape of the core 14 similarly to the sensor disclosed in Japanese Patent Application Publication No. 2002-296305, and the connecting portion 14b of the separate member is fitted and fixed to the magnetic gap of the core 14. However, in this case, it is not desirable since cost is increased in comparison with the first embodiment by cost provided by adding manufacture cost required to make the connecting portion 14b by the member separated from the core 14 (core cutting piece 15) and manufacture cost required to fit and fix this connecting portion 14b to the magnetic gap of the core 14.

[1-4] If the width W of the connecting portion 14b of the core 14 shown in FIG. 3 is widely set, the operation and effect of the above [1-1] can be raised. However, if the width W of the connecting portion 14b is widened, the magnetic flux density of the magnetic path formed in the notch portion 14a is reduced. Therefore, there is a fear that the function as the magnetic gap of the notch portion 14a is obstructed and the accuracy and sensitivity of the electric current detection using the Hall element 12 are reduced.

Accordingly, the width W of the connecting portion 14b of the core 14 is set by experimentally finding an optimum value by cut and try such that the operation and effect of the above [1-1] are sufficiently obtained and the accuracy and sensitivity of the electric current detection using the Hall element 12 are further not reduced.

Second Embodiment

Figure 5:
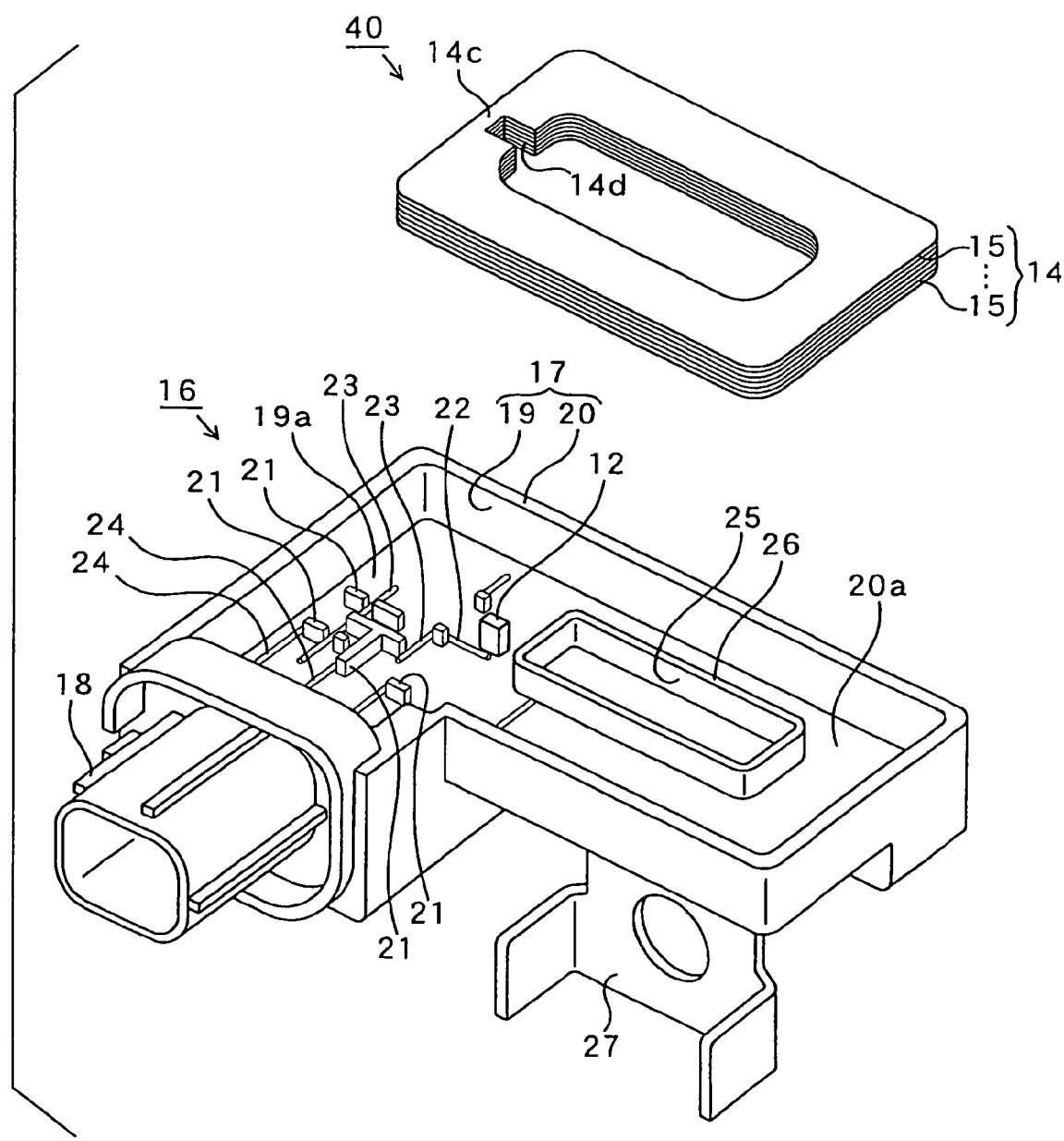
FIG. 5 is an exploded perspective view showing an electric current sensor according to a second embodiment of the present invention.

FIG. 5 is an exploded perspective view of a main portion for explaining the schematic construction of an electric current sensor 40 according to a second embodiment of the present invention.

Figure 6:
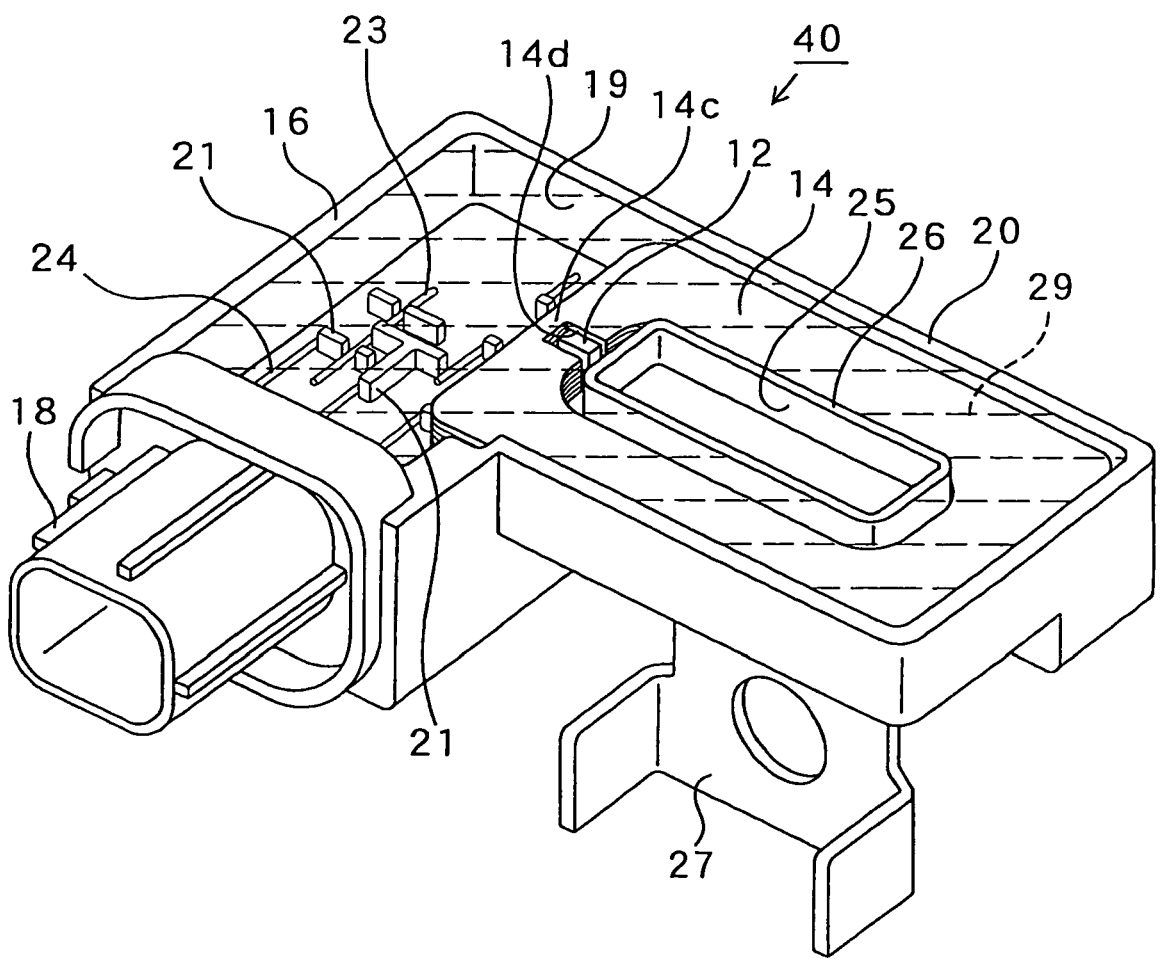
FIG. 6 is a perspective view showing the sensor according to the second embodiment.

FIG. 6 is a perspective view of the electric current sensor 40.

Figure 7:
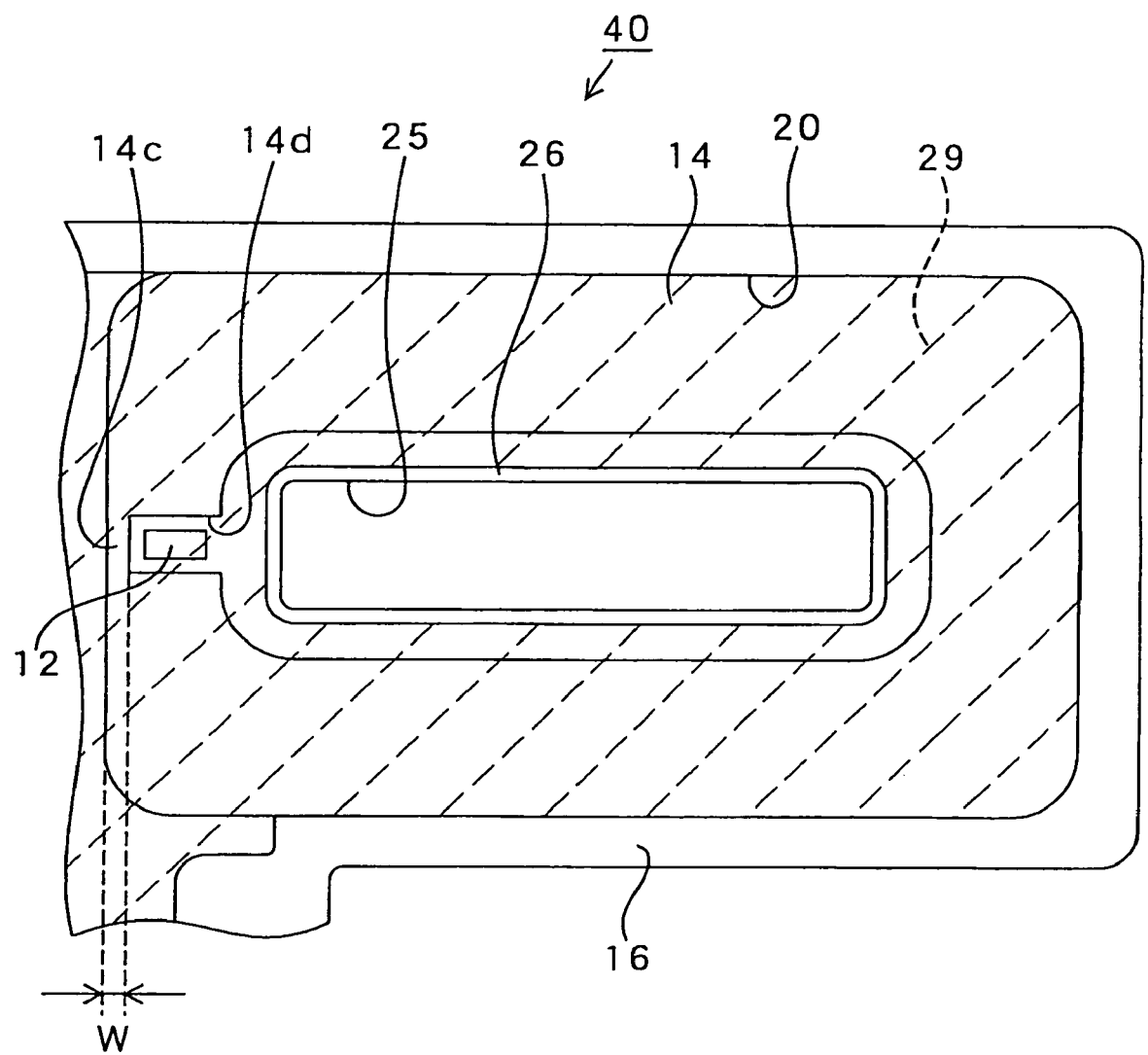
FIG. 7 is a partial plan view showing a main part of the sensor according to the second embodiment.

FIG. 7 is a plan view of a main portion of the electric current sensor 40.

Figure 8:
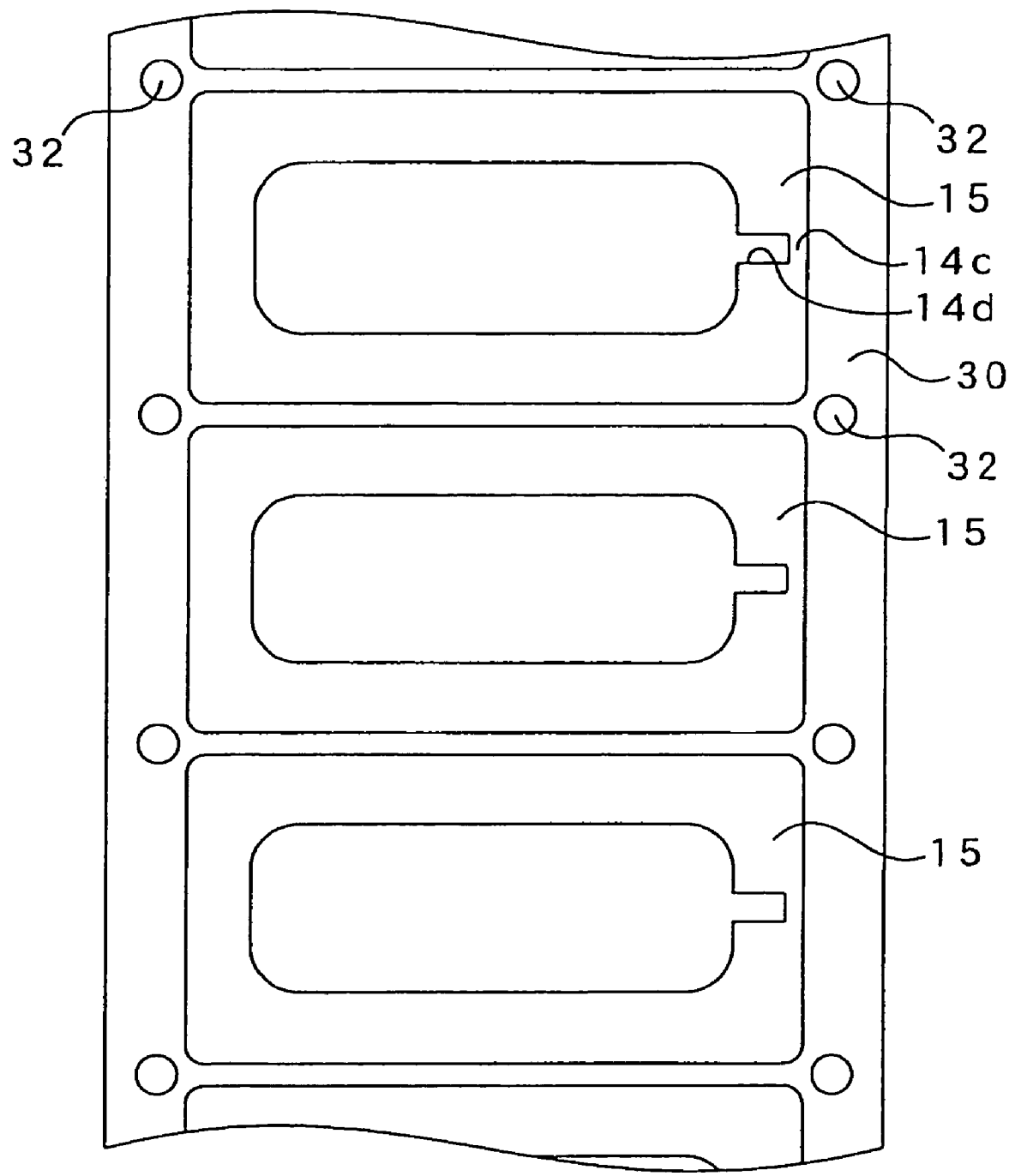
FIG. 8 is a partial plan view showing a hoop member of the sensor according to the second embodiment.

FIG. 8 is a plan view of the hoop member 30 for forming the core cutting piece 15 constituting the core 14.

In the second embodiment, the electric current sensor 40 differs from the electric current sensor 10 of the first embodiment in that a notch portion 14d is formed by notching the inside portion of one portion (one portion of the short side of an approximately rectangular shape in the illustrated example) of the ring shape of the core 14 (core cutting piece 15) toward the outside in a concave shape, and a connecting portion 14c is formed by connecting the core 14 outside this notch portion 14d. The notch portion 14d functions as the magnetic gap of the core 14. The connecting portion 14c corresponds to the deformation preventing means.

Namely, the notch portion 14a and the connecting portion 14b of the first embodiment are respectively replaced with the notch portion 14d and the connecting portion 14c of the second embodiment.

In the electric current sensor 40, a short side portion of the core 14 having the notch portion 14d is projected into the circuit storing portion 19, and the Hall element 12 is arranged by forming a clearance approximately in the central position of the notch portion 14d functioning as the magnetic gap so as not to come in contact with the core 14.

Thus, in the second embodiment, since the core 14 is connected by the connecting portion 14c outside the notch portion 14d of the core 14, the deformation of the notch portion 14d is restrained by the connecting portion 14c even when stress generated by hardening the sealant 29 is applied to the core 14. Hence, no size shape of the notch portion 14d functioning as the magnetic gap of the core 14 is changed from a set value.

Accordingly, an operation and an effect similar to those of the first embodiment can be also obtained in the second embodiment.

Third Embodiment

Figure 9:
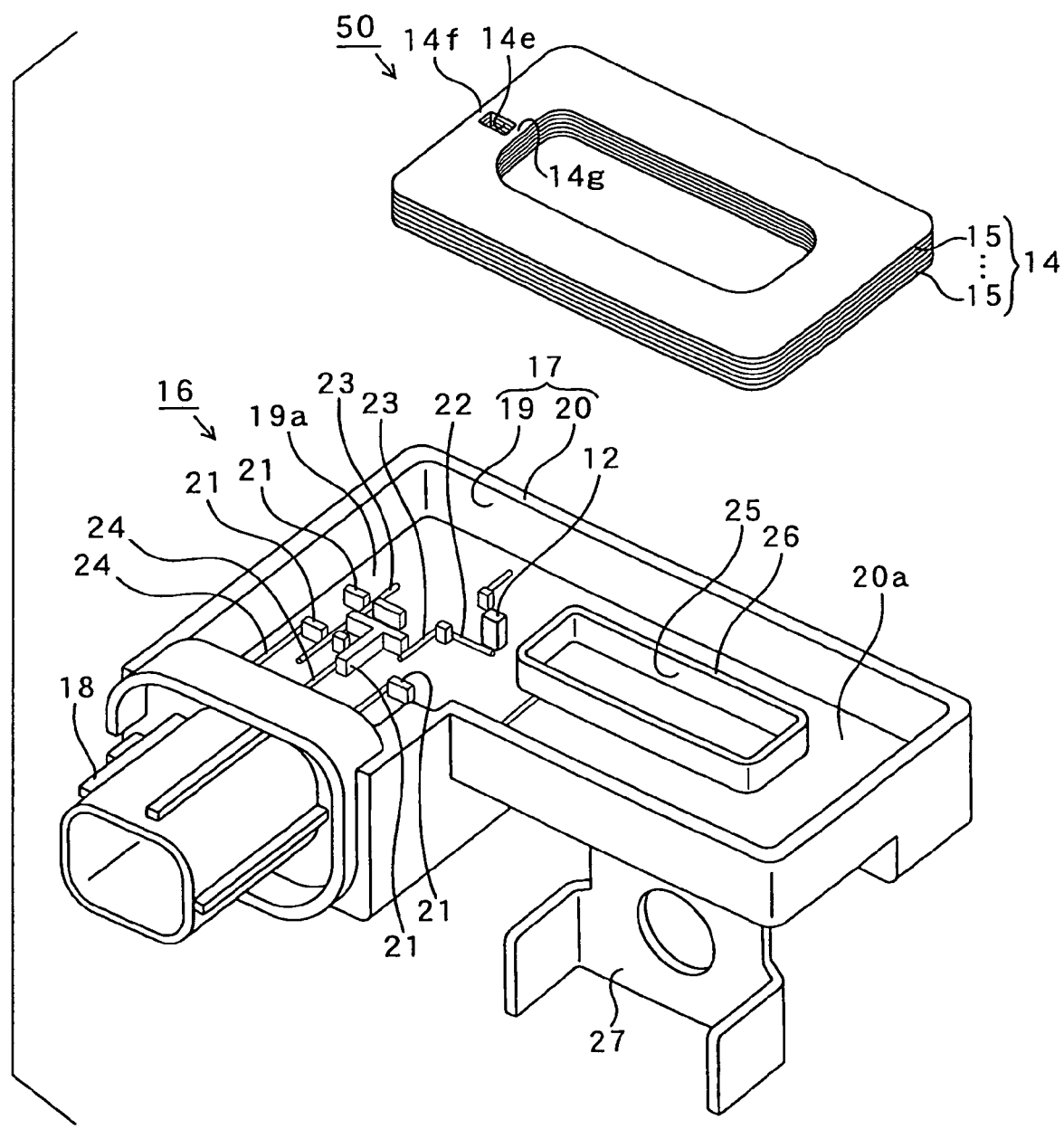
FIG. 9 is an exploded perspective view showing an electric current sensor according to a third embodiment of the present invention.

FIG. 9 is an exploded perspective view of a main portion for explaining the schematic construction of an electric current sensor 50 according to a third embodiment of the present invention.

Figure 10:
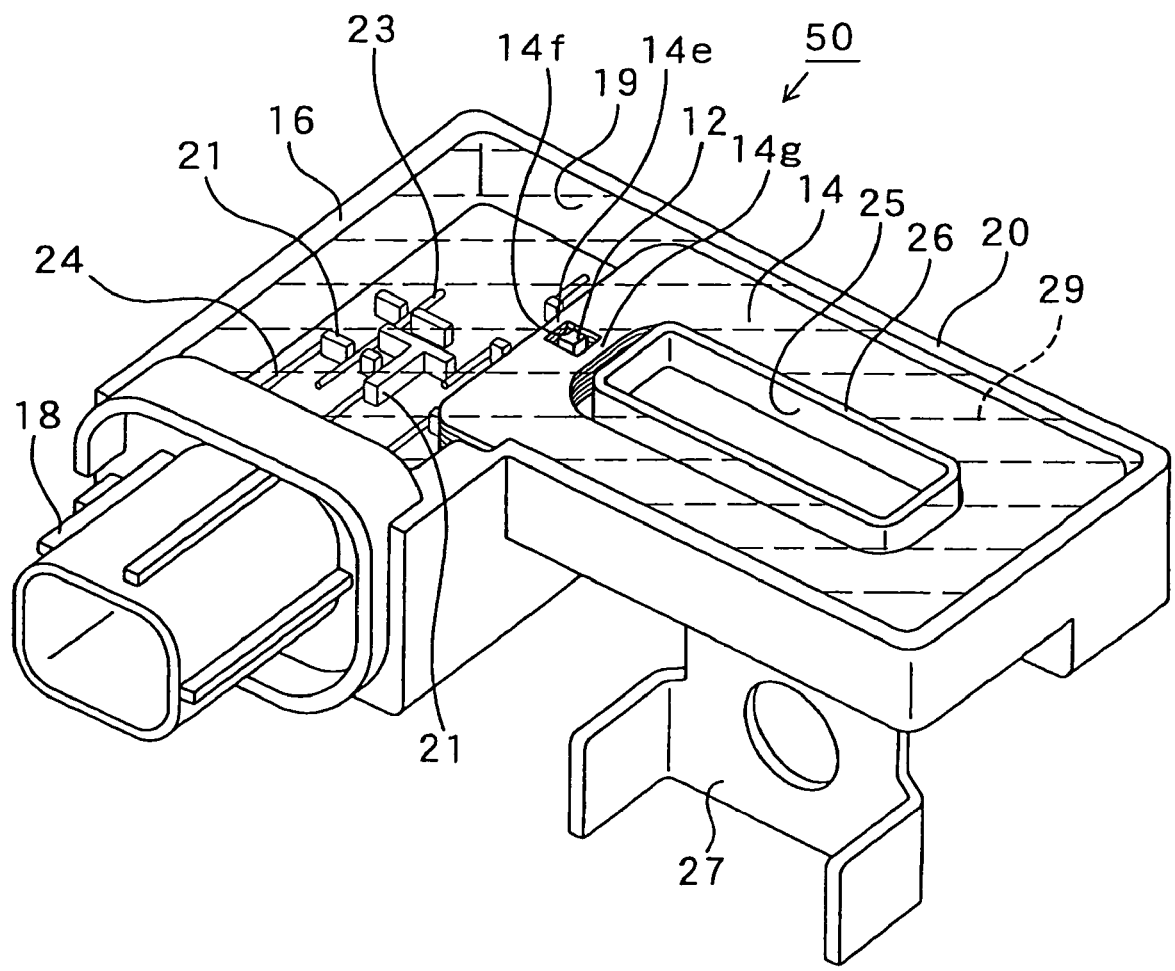
FIG. 10 is a perspective view showing the sensor according to the third embodiment.

FIG. 10 is a perspective view of the electric current sensor 50.

Figure 11:
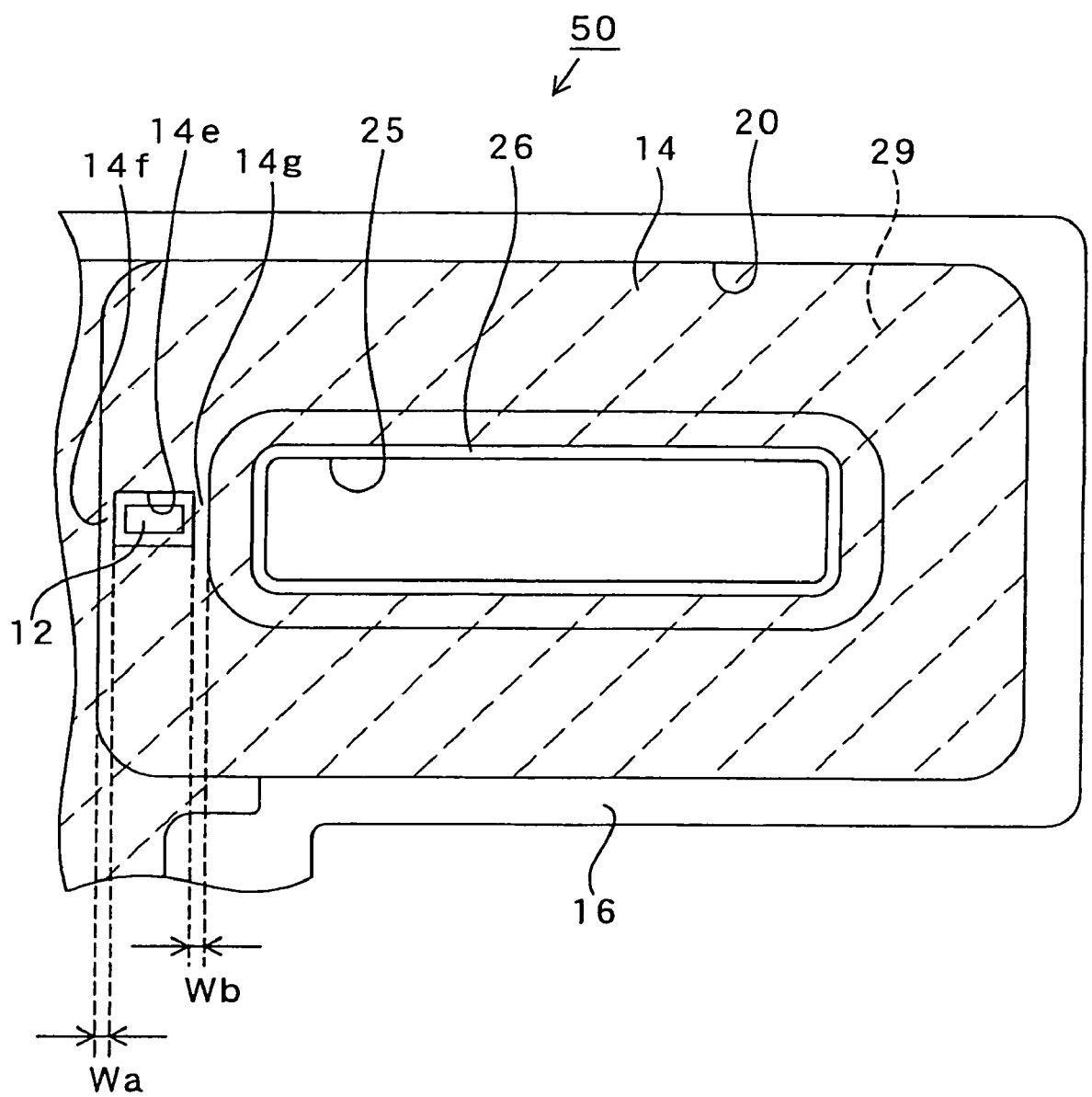
FIG. 11 is a partial plan view showing a main part of the sensor according to the third embodiment.

FIG. 11 is a plan view of a main portion of the electric current sensor 50.

Figure 12:
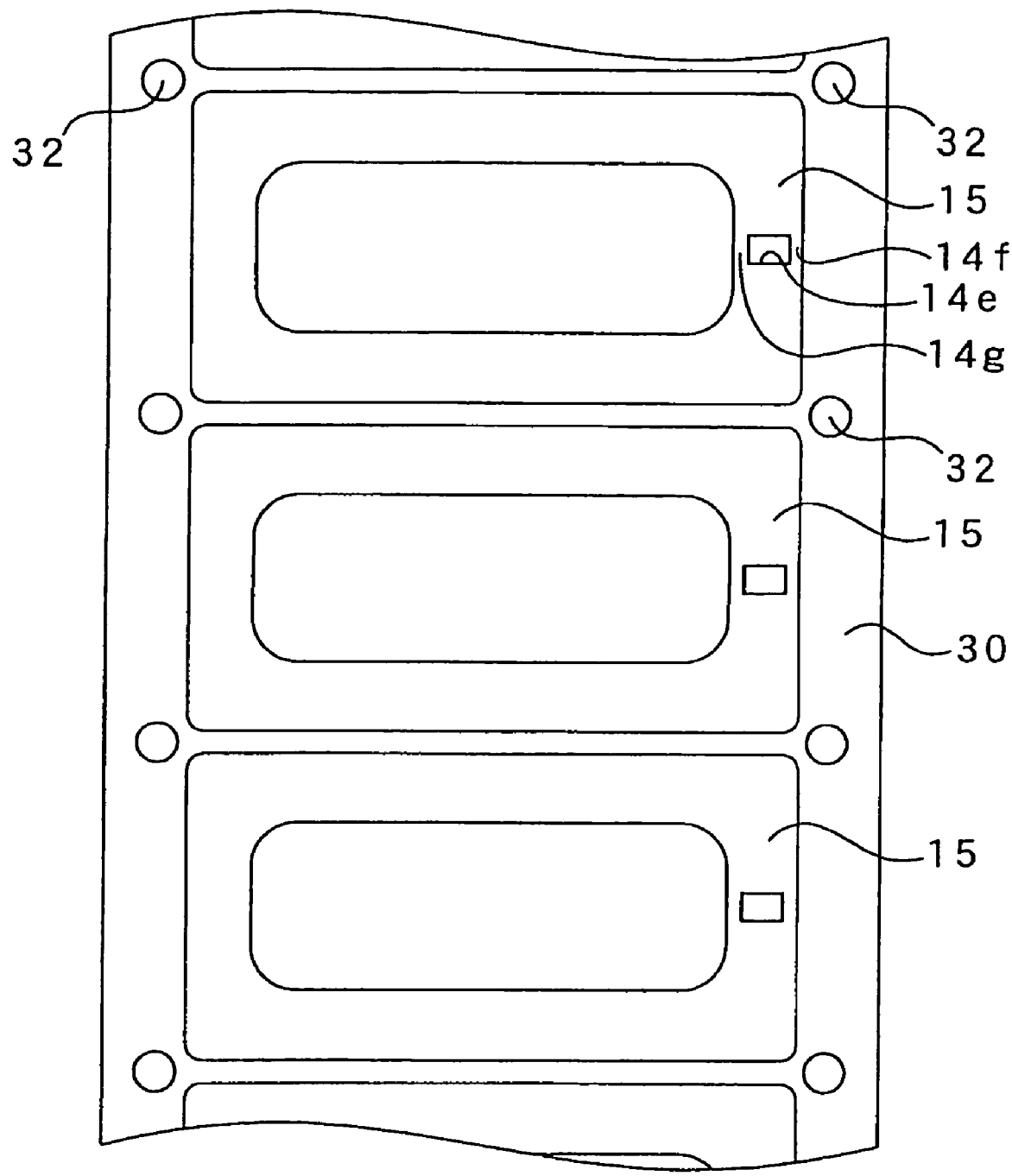
FIG. 12 is a partial plan view showing a hoop member of the sensor according to the third embodiment.

FIG. 12 is a plan view of a hoop member 30 for forming the core cutting piece 15 constituting the core 14.

The electric current sensor 50 of the third embodiment differs from the electric current sensor 10 of the first embodiment in that a through hole 14e of a rectangular shape is formed so as to extend through one portion (one portion of the short side of an approximately rectangular shape in the illustrated example) of the ring shape of the core 14 (core cutting piece 15), and a connecting portion 14f is formed by connecting the core 14 outside this through hole 14e, and a connecting portion 14g is formed by connecting the core 14 inside the through hole 14e. The through hole 14e functions as the magnetic gap of the core 14.

Namely, the notch portion 14a and the connecting portion 14b of the first embodiment are respectively replaced with the through hole 14e and each of the connecting portions 14f, 14g in the third embodiment.

In the electric current sensor 50 of the third embodiment, a short side portion of the core 14 having the through hole 14e is projected into the circuit storing portion 19, and the Hall element 12 is arranged by forming a gap approximately in the central position of the through hole 14e functioning as the magnetic gap so as not to come in contact with the core 14.

[Operation and Effect]

The following operation and effect can be obtained in accordance with the third embodiment.

[3-1] Since the core 14 is connected by the connecting portions 14g, 14f on both the inside and the outside of the through hole 14e of the core 14, the deformation of the through hole 14e is restrained by each of the connecting portions 14f, 14g even when stress generated by hardening the sealant 29 is applied to the core 14. Accordingly, no size shape of the through hole 14e functioning as the magnetic gap of the core 14 is changed from a set value.

In accordance with the third embodiment in which the core 14 is connected by the connecting portions 14g, 14f on both the inside and the outside of the through hole 14e of the core 14, the deformation of a portion (through hole 14e) functioning as the magnetic gap can be more reliably restrained in comparison with the first embodiment and the second embodiment in which the core 14 is connected by the connecting portions 14b, 14c on one side of the inside and the outside of the notch portions 14a, 14d of the core 14. Therefore, the operation and effect of the above [1-1] and [1-2] of the first embodiment can be further raised.

[3-2] The operation and effect of the above [3-1] can be raised if the widths Wa, Wb of the respective connecting portions 14f, 14g of the core 14 shown in FIG. 11 are widely set. However, when the widths Wa, Wb of the respective connecting portions 14f, 14g are widened, the magnetic flux density of a magnetic path formed in the through hole 14e is reduced. Therefore, there is a fear that the function as the magnetic gap of the through hole 14e is obstructed, and the accuracy and sensitivity of electric current detection using the Hall element 12 are reduced.

Accordingly, the widths Wa, Wb of the respective connecting portions 14f, 14g of the core 14 are set by experimentally finding an optimum value by cut and try such that the operation and effect of the above [3-1] are sufficiently obtained and the accuracy and sensitivity of the electric current detection using the Hall element 12 are further not reduced.

Fourth Embodiment

Figure 13:
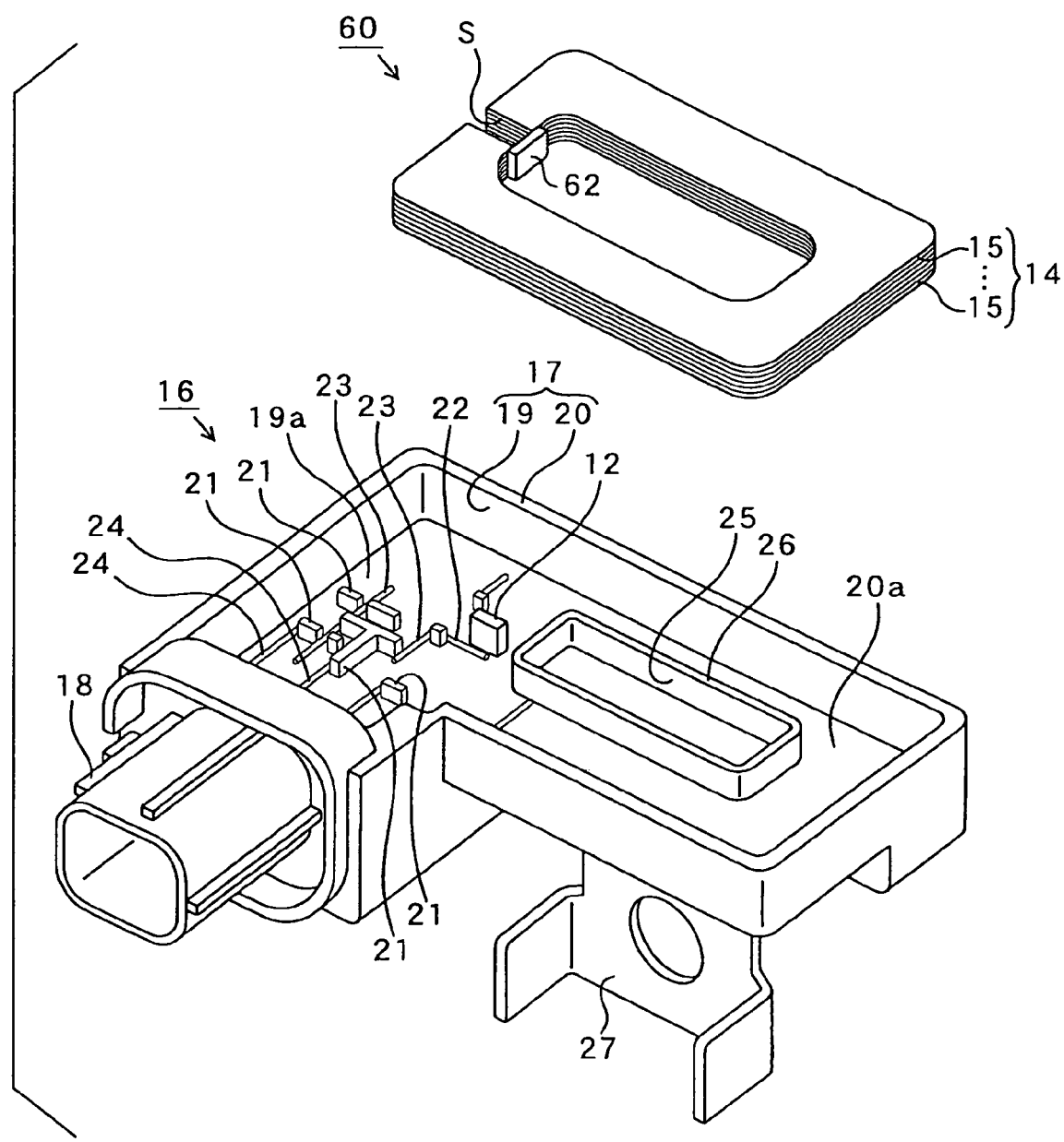
FIG. 13 is an exploded perspective view showing an electric current sensor according to a fourth embodiment of the present invention.

FIG. 13 is an exploded perspective view of a main portion for explaining the schematic construction of an electric current sensor 60 according to a fourth embodiment of the present invention.

Figure 14:
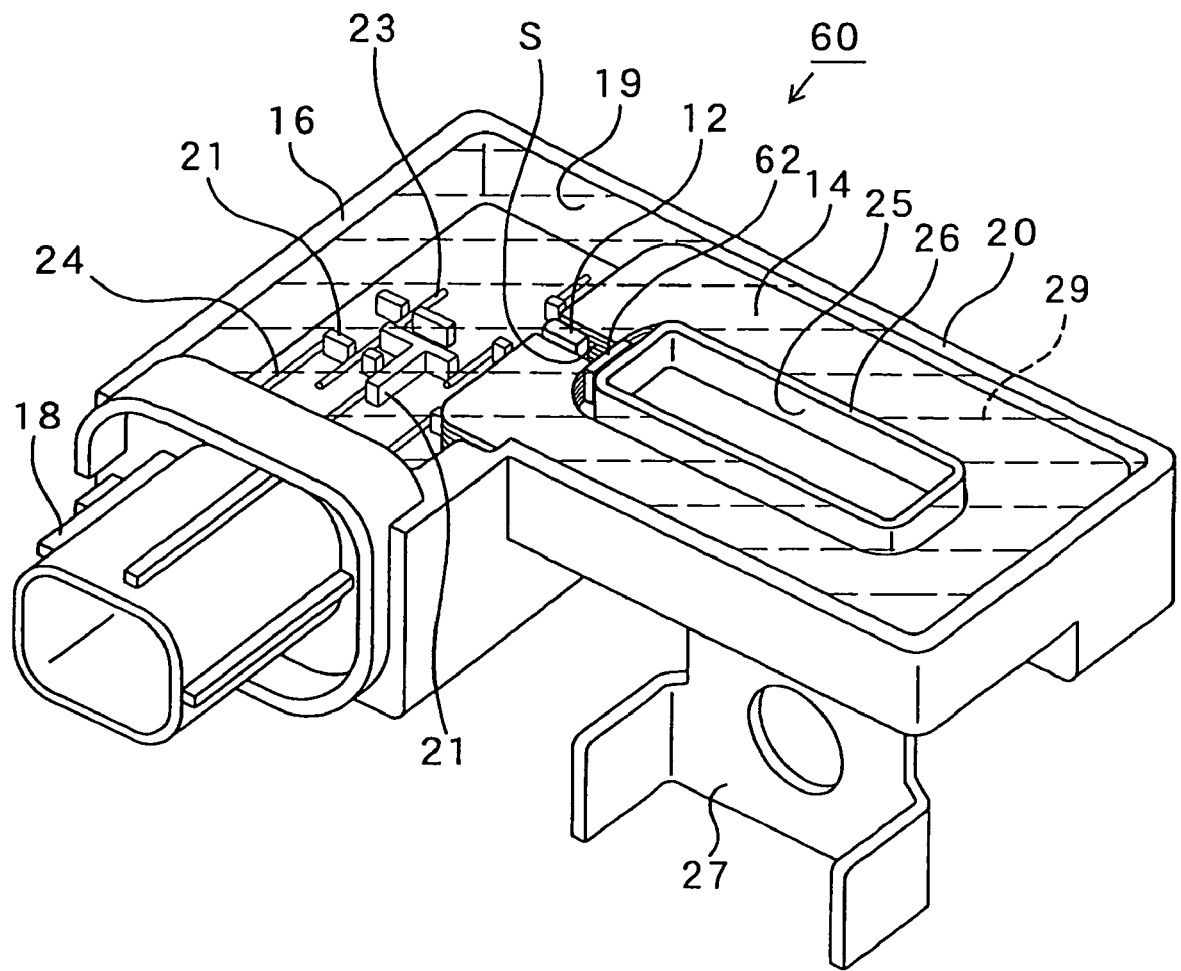
FIG. 14 is a perspective view showing the sensor according to the fourth embodiment.

FIG. 14 is a perspective view of the electric current sensor 60.

Figure 15:
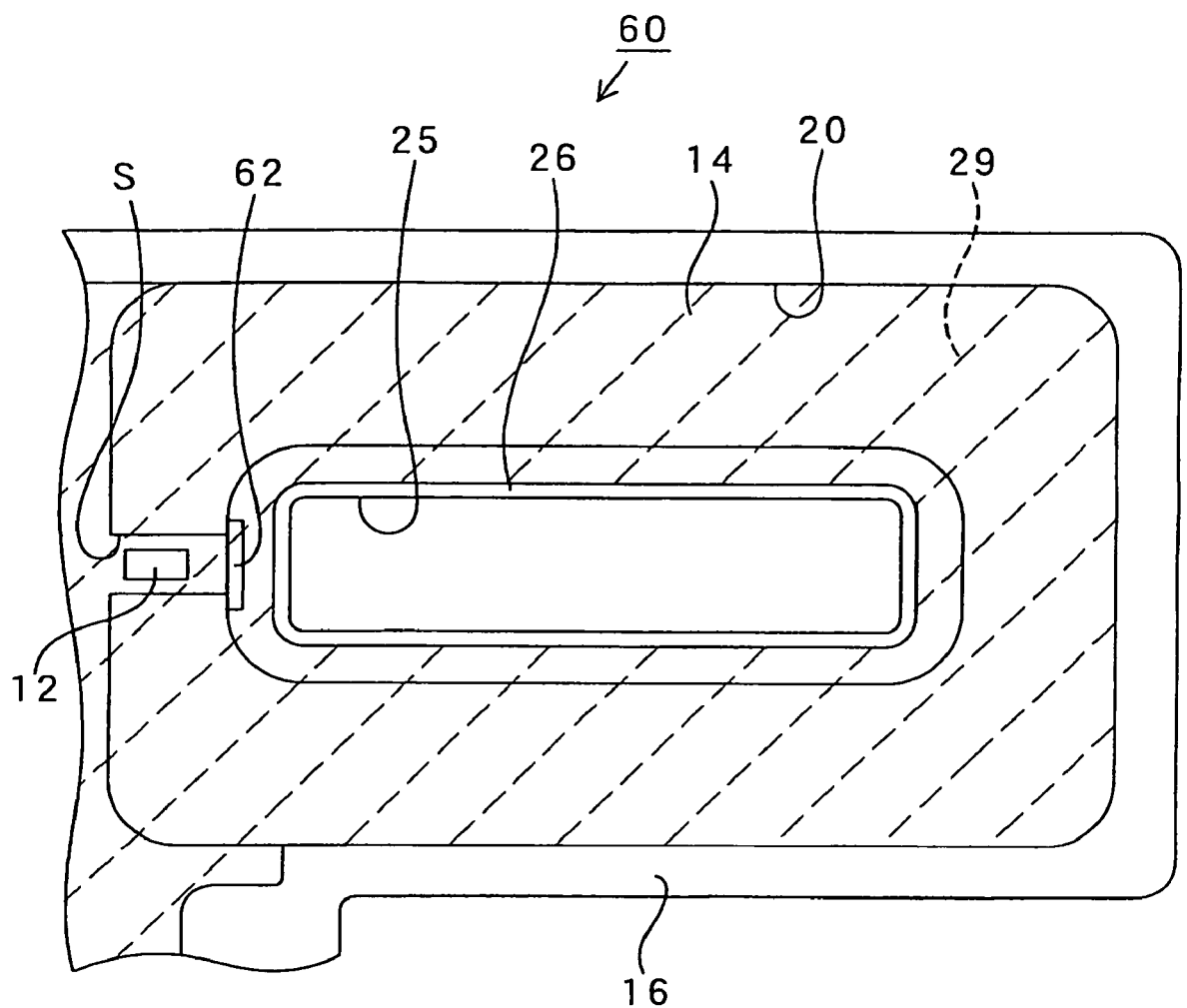
FIG. 15 is a partial plan view showing a main part of the sensor according to the fourth embodiment.

FIG. 15 is a plan view of a main portion of the electric current sensor 60.

The electric current sensor 60 of the fourth embodiment differs from the electric current sensor 10 of the first embodiment in the following points.

[A] A magnetic gap S is formed by cutting and opening one portion (one portion of the short side of an approximately rectangular shape in the illustrated example) of the ring shape of the core 14 (core cutting piece 15).

[B] A reinforcing member 62 of a plate shape is adhered and fixed to the inside portion of the magnetic gap S in the core 14. The reinforcing member 62 is formed by a nonmagnetic material having sufficient strength. For example, there are a synthetic resin material, various kinds of metallic materials (aluminum alloy, copper alloy, etc.) as such a nonmagnetic material.

The reinforcing member 62 corresponds to the deformation preventing means.

Namely, the electric current sensor 60 is constructed by the Hall element 12, the core 14 (core cutting piece 15), the box body 16 (the storing portion 17, the connector mounting portion 18, the circuit storing portion 19, the core storing portion 20, the insertion hole 25 and the outer circumferential wall 26), the electronic part 21, the wiring members 22 to 24, the attachment fitting 27, the sealant 29, the reinforcing member 62, etc.

[C] A short side portion of the core 14 having the magnetic gap S is projected into the circuit storing portion 19, and the Hall element 12 is arranged by forming a gap approximately in the central position of the magnetic gap S so as not to come in contact with the core 14.

Thus, in the fourth embodiment, the reinforcing member 62 is adhered and fixed in the inside portion of the magnetic gap S of the core 14, and the inside portion of the magnetic gap S is connected by this reinforcing member 62. Therefore, the deformation of the magnetic gap S is restrained by the reinforcing member 62 even when stress generated by hardening the sealant 29 is applied to the core 14. Hence, no size shape of the magnetic gap S is changed from a set value.

Accordingly, in the sensor according to the fourth embodiment, an operation and an effect similar to those of the above [1-1] and [1-2] of the first embodiment can be obtained.

Fifth Embodiment

Figure 16:
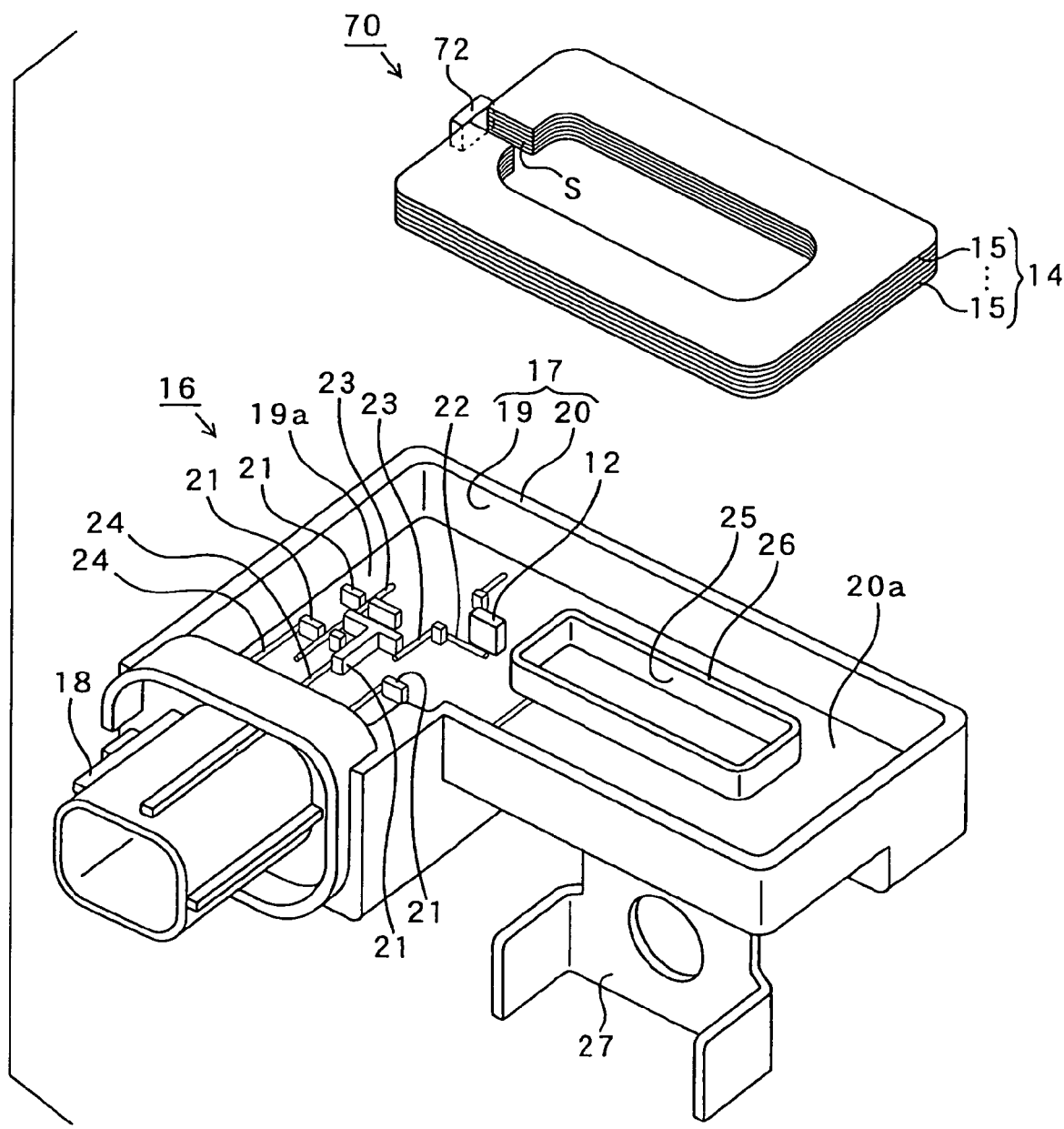
FIG. 16 is an exploded perspective view showing an electric current sensor according to a fifth embodiment of the present invention.

FIG. 16 is an exploded perspective view of a main portion for explaining the schematic construction of an electric current sensor 70 according to a fifth embodiment of the present invention.

Figure 17:
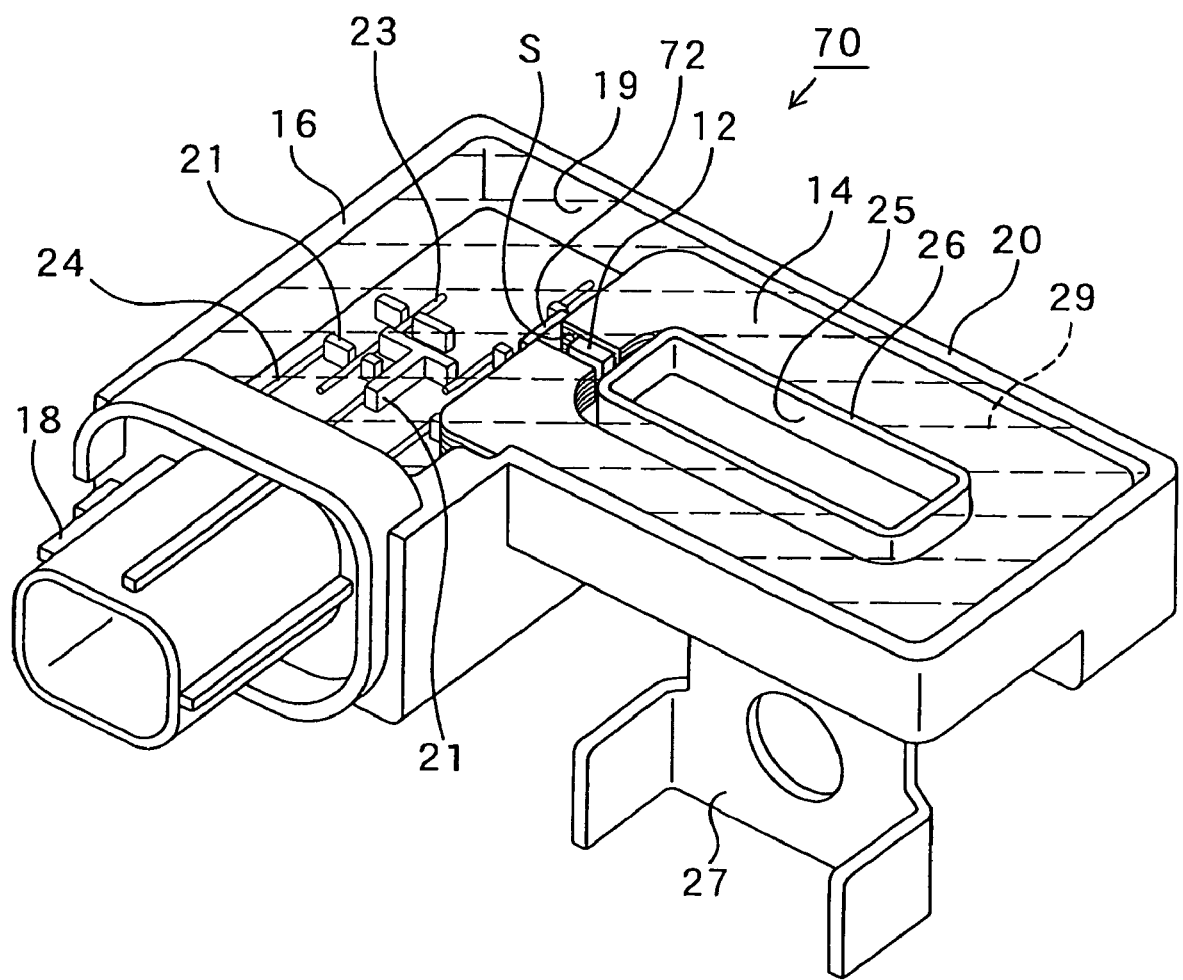
FIG. 17 is a perspective view showing the sensor according to the fifth embodiment.

FIG. 17 is a perspective view of the electric current sensor 70.

Figure 18:
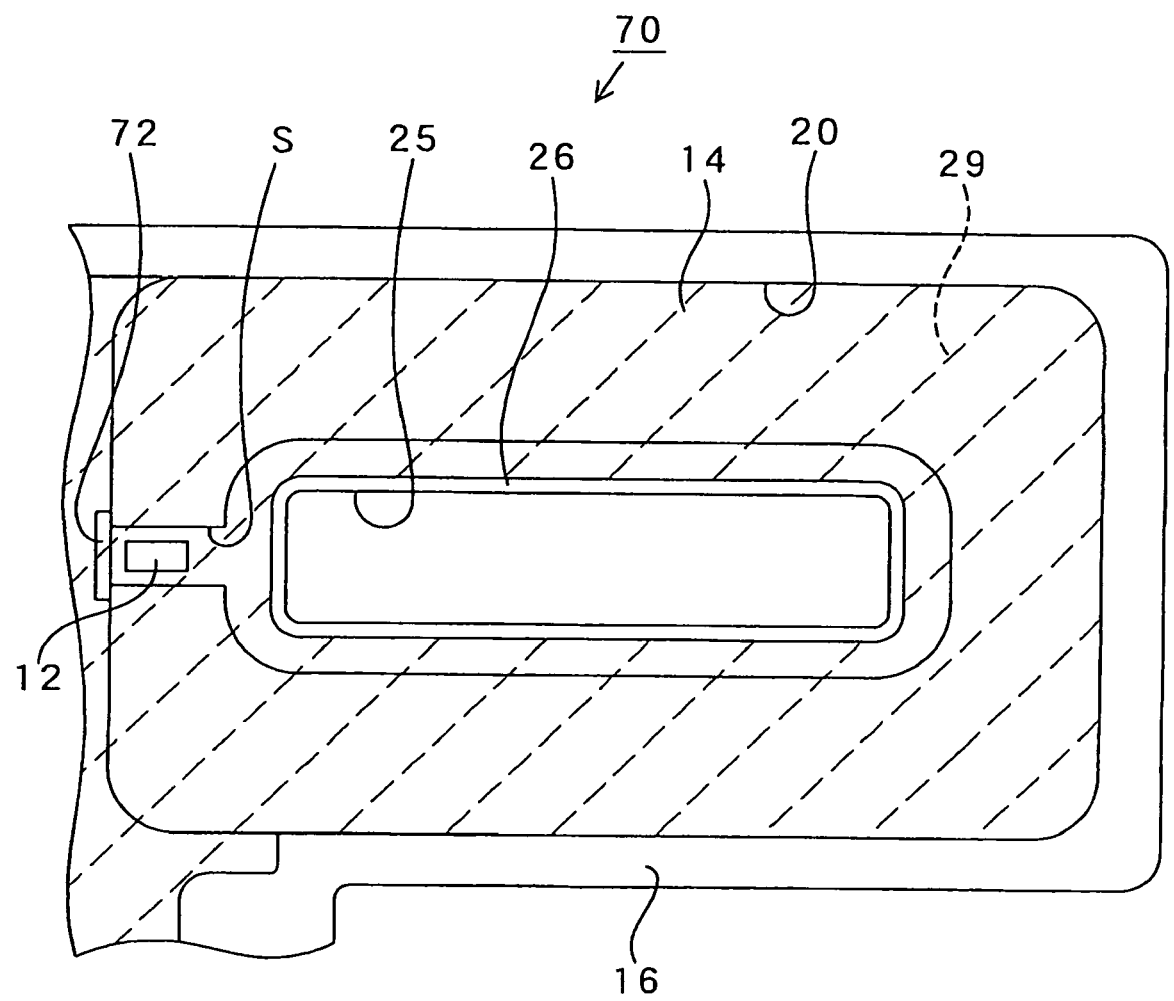
FIG. 18 is a partial plan view showing a main part of the sensor according to the fifth embodiment.

FIG. 18 is a plan view of a main portion of the electric current sensor 70.

The electric current sensor 70 of the fifth embodiment differs from the electric current sensor 60 of the fourth embodiment in that a reinforcing member 72 of a plate shape is adhered and fixed to the outside portion of the magnetic gap S in the core 14. Similar to the reinforcing member 62 of the fourth embodiment, the reinforcing member 72 is formed by a nonmagnetic material having sufficient strength.

The reinforcing member 72 corresponds to the deformation preventing means.

Namely, the reinforcing member 62 of the fourth embodiment is replaced with the reinforcing member 72 of the fifth embodiment.

In the fifth embodiment, the reinforcing member 72 is adhered and fixed to the outside portion of the magnetic gap S of the core 14, and the outside portion of the magnetic gap S is connected by this reinforcing member 72. Therefore, the deformation of the magnetic gap S is restrained by the reinforcing member 72 even when stress generated by hardening the sealant 29 is applied to the core 14. Hence, no size shape of the magnetic gap S is changed from a set value.

Accordingly, an operation and an effect similar to those of the fourth embodiment can be obtained in accordance with the fifth embodiment.

The fourth embodiment and the fifth embodiment may be used together.

Namely, the reinforcing member 62 similar to that in the fourth embodiment may be adhered and fixed to the inside portion of the magnetic gap S in the core 14, and the reinforcing member 72 similar to that in the fifth embodiment may be also adhered and fixed to the outside portion of the magnetic gap S.

Thus, the core 14 is connected by the reinforcing members 62, 72 on both the inside and the outside of the magnetic gap S. Therefore, the deformation of the magnetic gap S can be more reliably restrained in comparison with the fourth embodiment and the fifth embodiment in which the core 14 is connected by the reinforcing members 62, 72 on one of the inside and the outside of the magnetic gap S. Accordingly, the above operation and effect of the fourth embodiment can be further raised.

Sixth Embodiment

Figure 19:
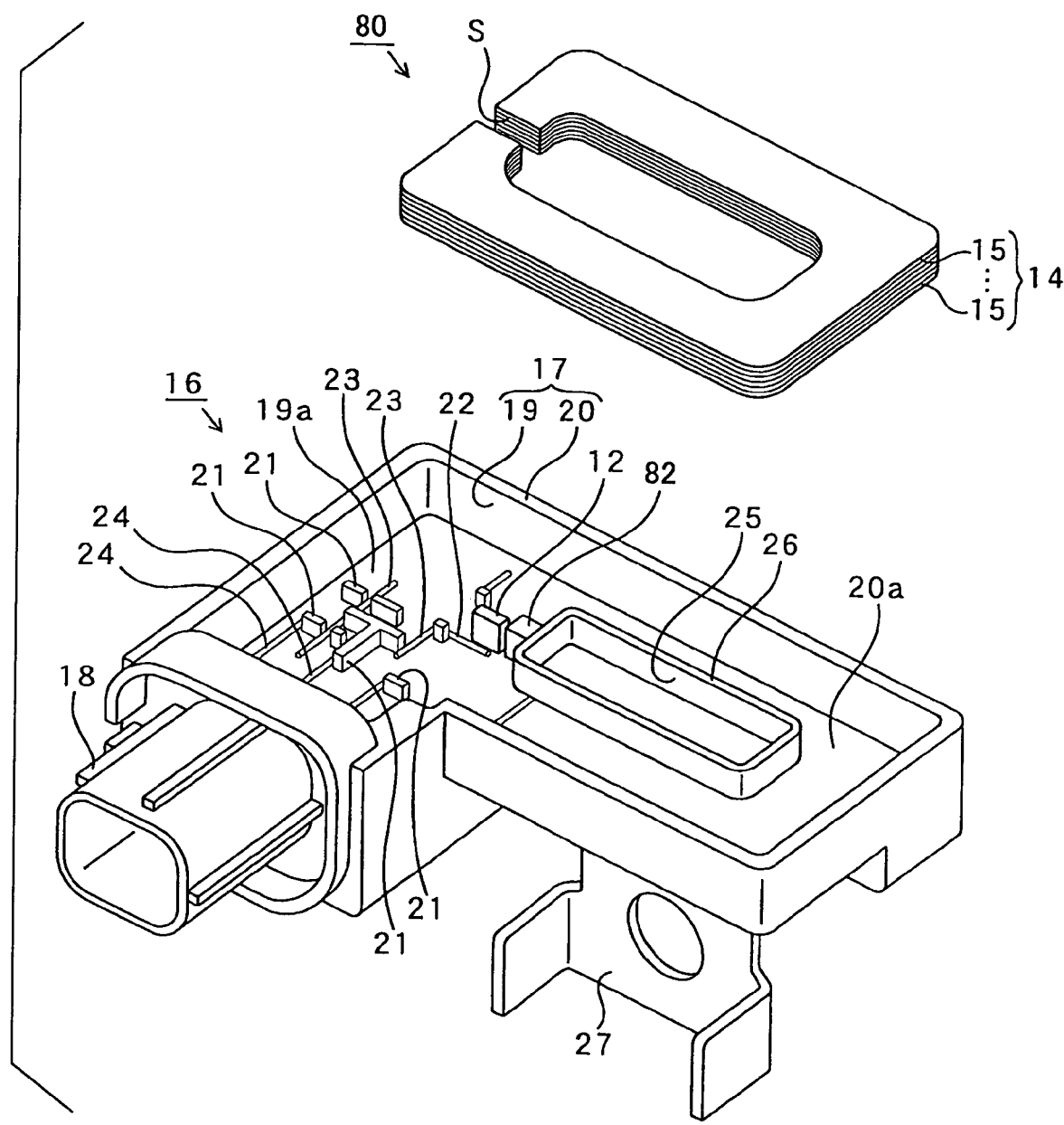
FIG. 19 is an exploded perspective view showing an electric current sensor according to a sixth embodiment of the present invention.

FIG. 19 is an exploded perspective view of a main portion for explaining the schematic construction of an electric current sensor 80 of a sixth embodiment of the present invention.

Figure 20:
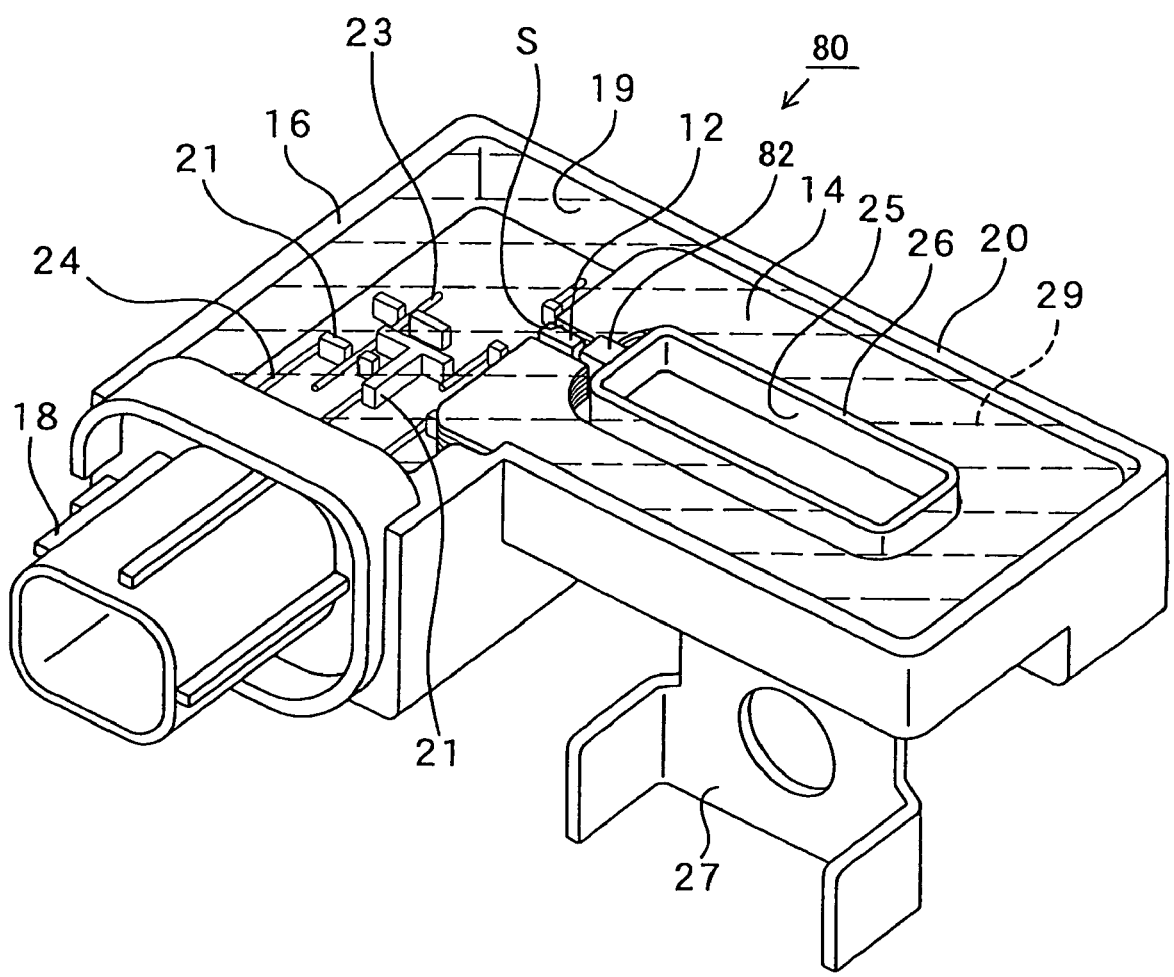
FIG. 20 is a perspective view showing the sensor according to the sixth embodiment.

FIG. 20 is a perspective view of the electric current sensor 80.

Figure 21:
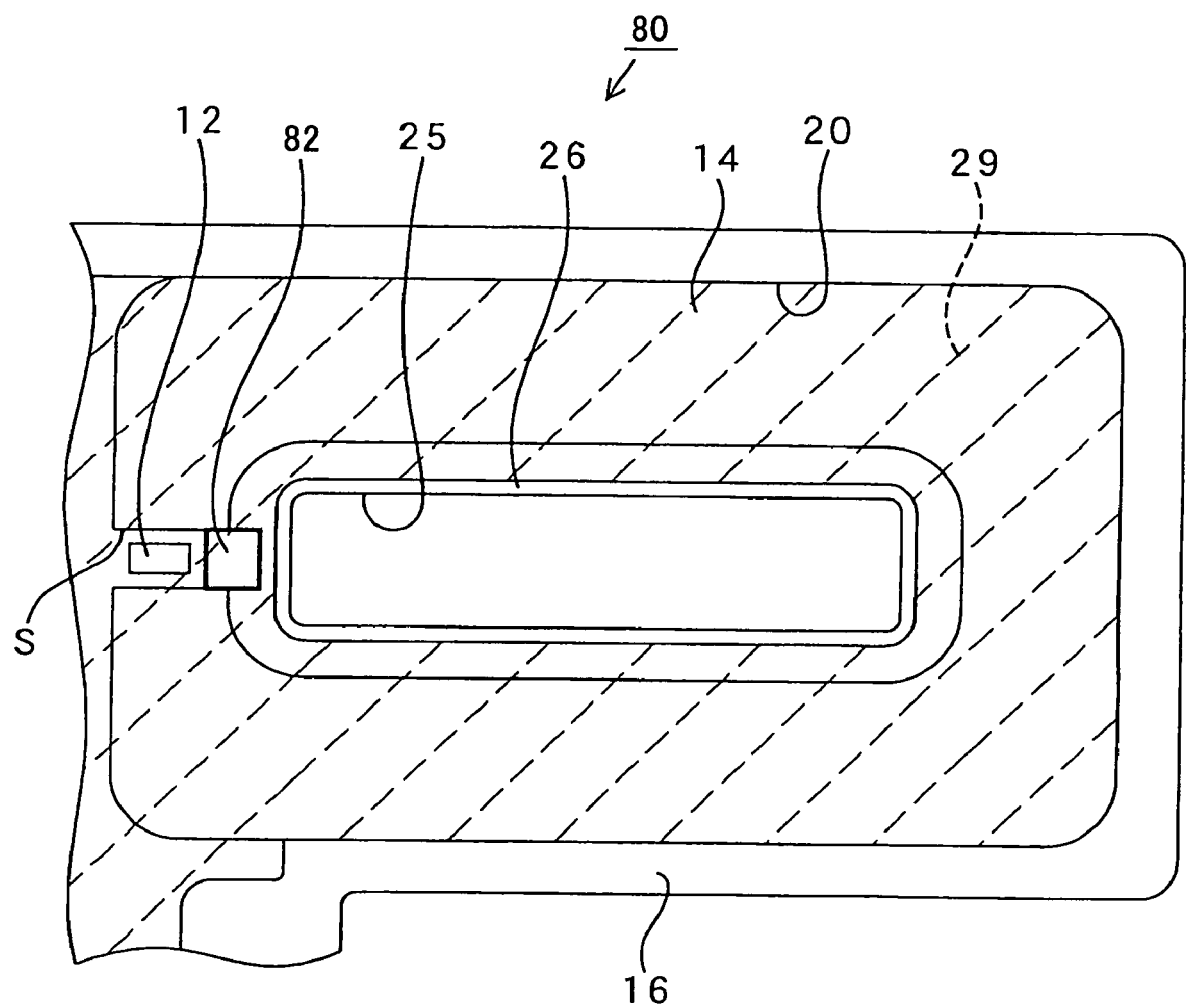
FIG. 21 is a partial plan view showing a main part of the sensor according to the sixth embodiment.

FIG. 21 is a plan view of a main portion of the electric current sensor 80.

The electric current sensor 80 is constructed by the Hall element 12, the core 14 (the core cutting piece 15 and the magnetic gap S), the box body 16 (the storing portion 17, the connector mounting portion 18, the circuit storing portion 19, the core storing portion 20, the insertion hole 25 and the outer circumferential wall 26), the electronic part 21, the wiring members 22 to 24, the attachment fitting 27, a regulating member (stopper) 82, the sealant 29, etc.

The regulating members 82 corresponding to the deformation preventing means.

The core 14 (core cutting piece 15) is formed in a ring shape of an approximately rectangular shape in which round portions are formed at the four corners. The magnetic gap S is formed by cutting and opening one portion (one portion of the short side of the approximately rectangular shape in the illustrated example) of this ring shape.

A short side portion of the core 14 having the magnetic gap S is projected into the circuit storing portion 19. The Hall element 12 is arranged by forming a gap approximately in the central position of the magnetic gap S so as not to come in contact with the core 14. For example, the clearance of the magnetic gap S is set to 2.5 mm, and the width of the Hall element 12 is set to 1.5 mm, and the gap between the Hall element 12 and the core 14 is set to 0.5 mm.

The regulating member 82 approximately formed in a rectangular shape rises between the Hall element 12 on the bottom face 19*a* of the circuit storing portion 19 and the outer circumferential wall 26. The arranging position and the size shape of the regulating member 82 are set such that the regulating member 82 is nipped without any clearance in the magnetic gap S of the core 14 when the core 14 is stored into the storing portion 17. The regulating member 82 is constructed by a synthetic resin material of a nonmagnetic substance and is formed integrally with the box body 16 by injection molding.

The interior of the storing portion 17 is filled with the sealant 29 (a slanting line hatching portion shown in FIGS. 20 and 21). A storing object (the Hall element 12, the core 14, the electronic part 21, the wiring members 22 to 24 and the regulating member 82) of the storing portion 17 is sealed by hardening the sealant 29, and the position of this storing object within the storing portion 17 is positioned and fixed.

When the electric current sensor 80 constructed in this way is used, an unillustrated electrically conductive member of a detecting object is first inserted into the insertion hole 25. Next, an unillustrated connector of an external device for inputting a detecting signal of the electric current sensor 80 is inserted into the connector mounting portion 18, and the external device and an unillustrated connector terminal within the connector mounting portion 18 are connected.

When an electric current is flowed to the electrically conductive member, a magnetic flux is generated within the core 14 by this electric current. The Hall element 12 arranged within a magnetic path formed in the magnetic gap S by this magnetic flux generates a voltage (Hall voltage) using the Hall effect corresponding to this magnetic flux.

Here, the Hall voltage generated by the Hall element 12 not only corresponds to the magnetic flux within the core 14, but also corresponds to the value of the electric current flowed to the electrically conductive member generating this magnetic flux. Therefore, it is said that the Hall voltage is a detecting signal of this electric current value. Therefore, the Hall voltage generated by the Hall element 12 is outputted to the above external device as the detecting signal.

Accordingly, the electric current sensor 80 can detect the value of the electric current flowed to the electrically conductive member inserted into the core 14 of the ring shape by the Hall element 12 arranged in the magnetic gap S of the core 14.

In this connection, for example, the electric current sensor 80 is used to detect the value of the electric current flowed to an electrically conductive member (bus bar) for connecting a car mounting battery of an automobile and a vehicle electric mounting article.

[Operation and Effect]

The following operation and effect can be obtained in accordance with the sixth embodiment.

[6-1] A storing object (the Hall element 12, the core 14, the electronic part 21, the wiring members 22 to 24 and the regulating member 82) is first attached into the storing portion 17 so as to manufacture the electric current sensor 80. Next, the interior of the storing portion 17 is filled with liquid having fluidity or the sealant 29 of a gel shape by flowing the liquid or the sealant 29 into the storing portion 17, or dropping (potting) the liquid or the sealant 29. Subsequently, the above storing object is sealed and fixed into the storing portion 17 in a state in which the above storing object is positioned within the storing portion 17 by hardening the sealant 29.

At this time, since the regulating member 82 is nipped without any clearance in the magnetic gap S of the core 14, the deformation of the magnetic gap S is restrained by the regulating member 82 even when stress generated by hardening the sealant 29 is applied to the core 14. Accordingly, no size shape of the magnetic gap S is changed from a set value.

Accordingly, in accordance with the sixth embodiment, the deformation of the magnetic gap S of the core 14 caused by hardening the sealant 29 is prevented and reductions in accuracy and sensitivity of electric current detection using the Hall element 12 can be avoided by arranging the regulating member 82.

[6-2] Any using material (e.g., various kinds of synthetic resin materials such as silicon, urethane, epoxy, etc.) may be used in the sealant 29 if this using material is a nonmagnetic material having a preferable working property of the filling to the storing portion 17 and able to reliably seal the storing object (the Hall element 12, the core 14, the electronic part 21, the wiring members 22 to 24 and the regulating member 82) of the storing portion 17 after the hardening.

In particular, when the sealant 29 having thermosetting property is used, large stress is generated at the thermosetting time of the sealant 29 by the linear expansion coefficient of this sealant 29. Therefore, the core 14 is easily deformed by this stress. However, in accordance with the sixth embodiment, the deformation of the magnetic gap S can be prevented. Therefore, the sealant 29 having the thermosetting property can be used.

Accordingly, in accordance with the sixth embodiment, a limit with respect to the using material of the sealant 29 is reduced and the stress generated at the hardening time is large. Instead of this, a cheap seal material can be used. Therefore, manufacture cost of the electric current sensor 80 can be reduced.

[6-3] The regulating member 82 is formed integrally with the box body 16 by injection molding. Accordingly, in accordance with the sixth embodiment, it is not necessary to add a special manufacture process to form the regulating member 82. Accordingly, no manufacture cost of the electric current sensor 80 is increased by arranging the regulating member 82.

In the above embodiment, the regulating member 82 and the box body 16 are integrally formed by injection molding. However, the regulating member 82 formed separately from the box body 16 may be also attached and fixed to the box body 16 (the bottom face 19a of the circuit storing portion 19).

Seventh Embodiment

Figure 22:
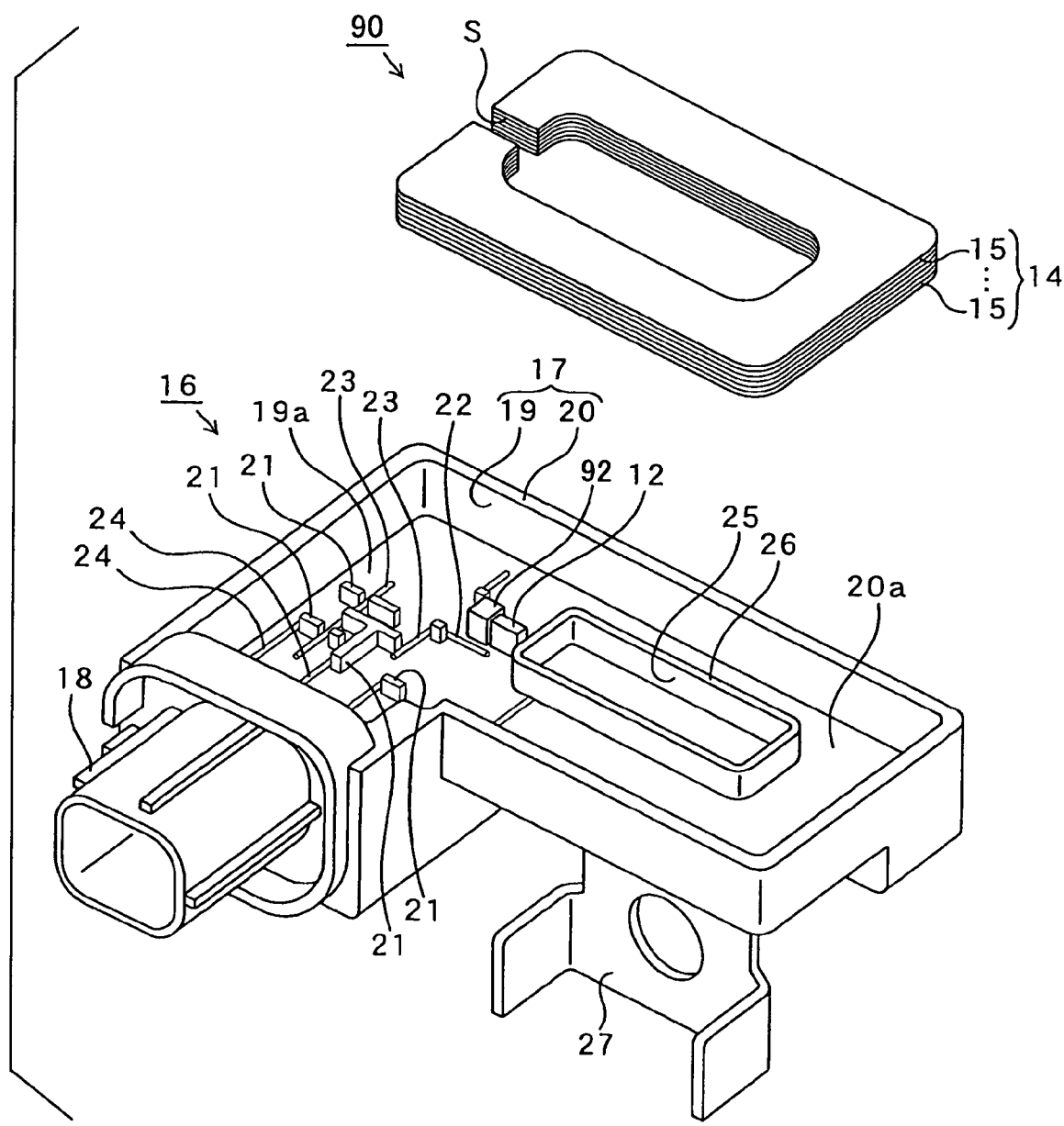
FIG. 22 is an exploded perspective view showing an electric current sensor according to a seventh embodiment of the present invention.

FIG. 22 is an exploded perspective view of a main portion for explaining the schematic construction of an electric current sensor 90 according to a seventh embodiment of the present invention.

Figure 23:
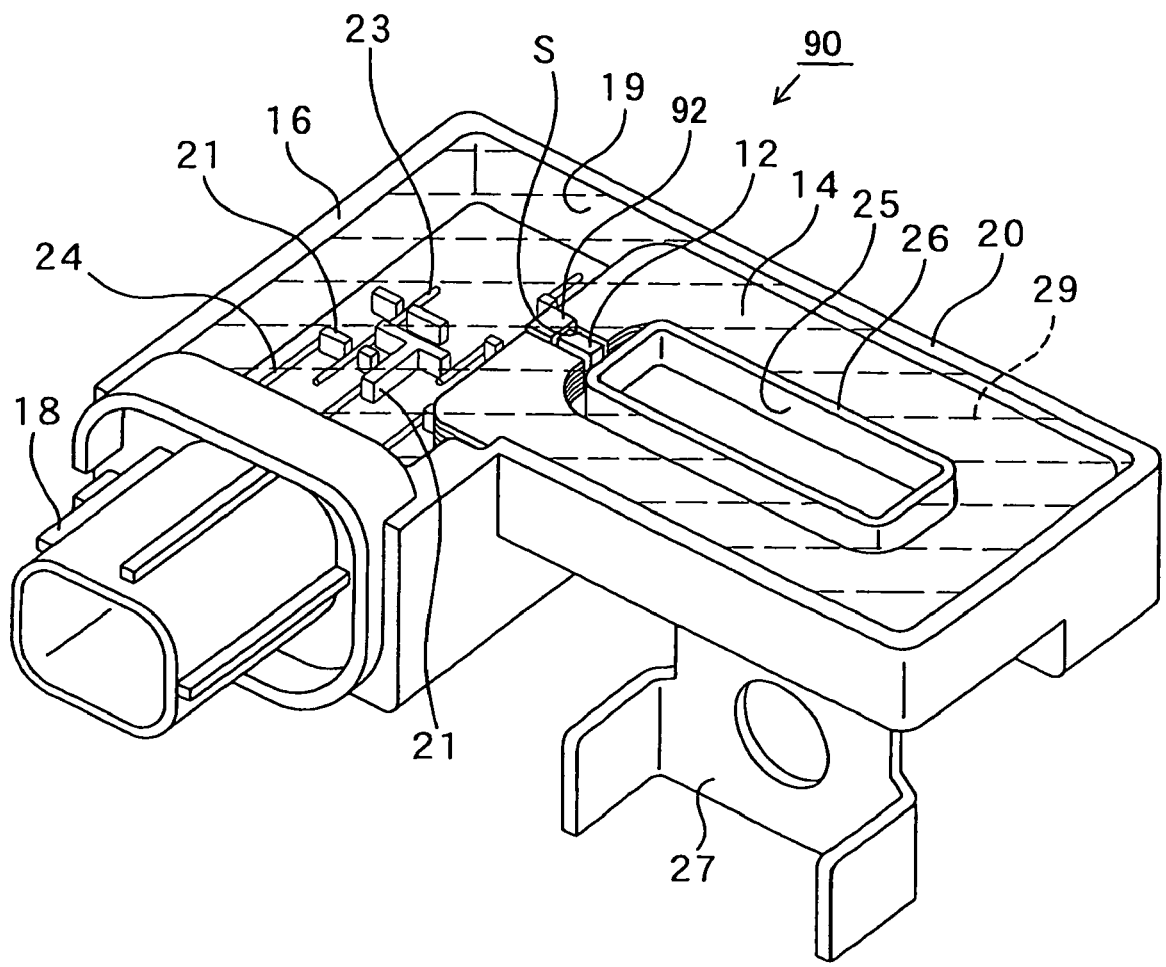
FIG. 23 is a perspective view showing the sensor according to the seventh embodiment.

FIG. 23 is a perspective view of the electric current sensor 90.

Figure 24:
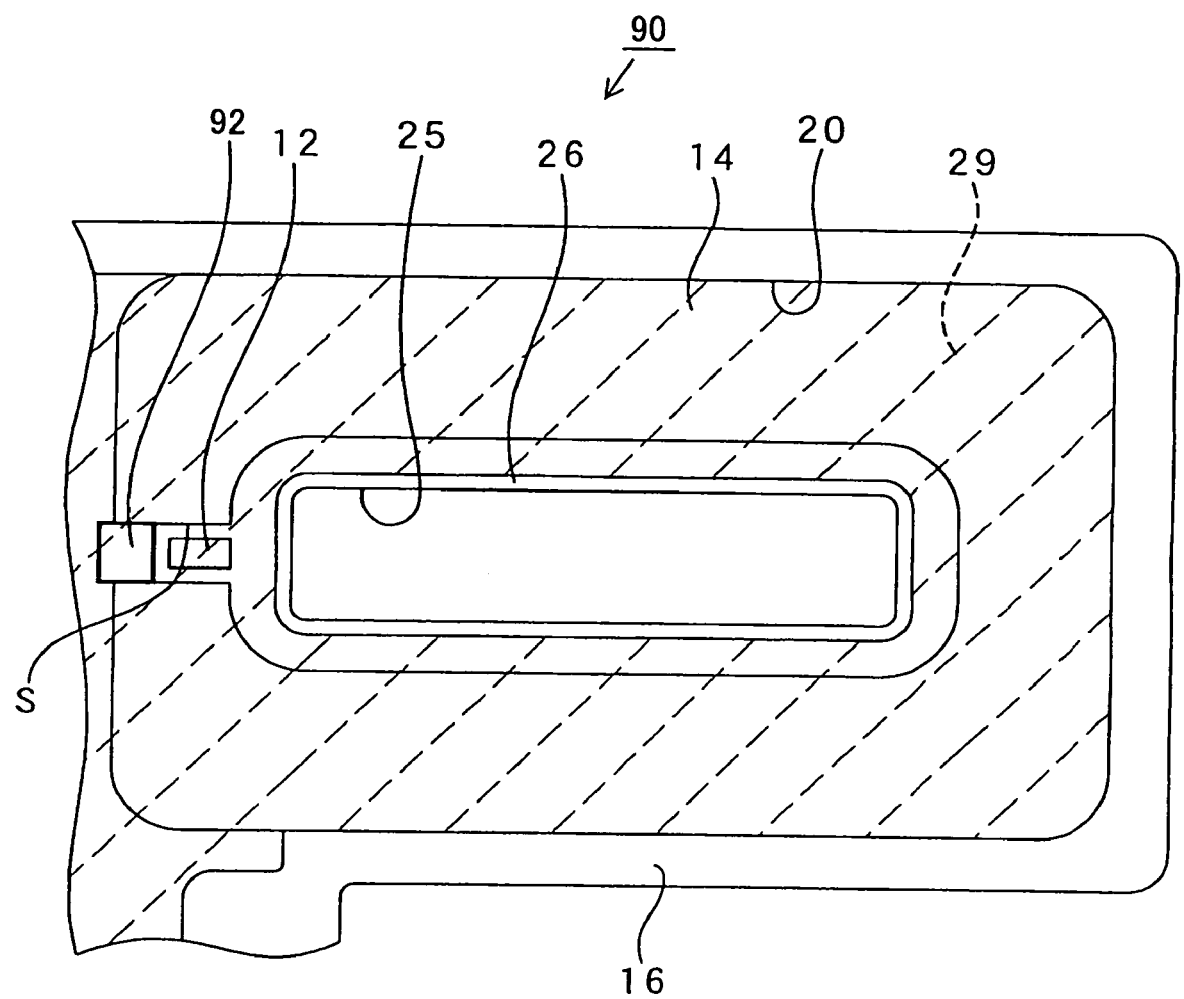
FIG. 24 is a partial plan view showing a main part of the sensor according to the seventh embodiment.

FIG. 24 is a plan view of a main portion of the electric current sensor 90.

The electric current sensor 90 of the seventh embodiment differs from the electric current sensor 80 of the sixth embodiment in that the regulating member 82 is omitted and a regulating member 92 of the same size shape as the regulating member 82 is arranged instead of the regulating member 82.

The regulating member 92 corresponds to the deformation preventing means.

Namely, the electric current sensor 90 is constructed by the Hall element 12, the core 14 (the core cutting piece 15 and the magnetic gap S), the box body 16 (the storing portion 17, the connector mounting portion 18, the circuit storing portion 19, the core storing portion 20, the insertion hole 25 and the outer circumferential wall 26), the electronic part 21, the wiring members 22 to 24, the attachment fitting 27, the sealant 29, the regulating member 92, etc.

The Hall element 12 is attached and fixed between the outer circumferential wall 26 and the regulating member 92 on the bottom face 19a of the circuit storing portion 19. The arranging position and the size shape of the regulating member 92 are set so as to be nipped without any clearance in the magnetic gap S of the core 14 when the core 14 is stored into the storing portion 17. The regulating member 92 is constructed by a synthetic resin material of a nonmagnetic substance and is formed integrally with the box body 16 by injection molding.

Namely, the regulating member 82 of the sixth embodiment is nipped in the inside portion of the Hall element 12 in the magnetic gap S. In contrast to this, the regulating member 92 of the seventh embodiment is nipped in the outside portion of the Hall element 12 in the magnetic gap S.

Thus, in the seventh embodiment, the regulating member 92 is nipped without any clearance in the magnetic gap S of the core 14. Therefore, even when stress generated by hardening the sealant 29 is applied to the core 14, the deformation of the magnetic gap S is restrained by the regulating member 92 and no size shape of the magnetic gap S is changed from a set value.

Accordingly, an operation and an effect similar to those of the sixth embodiment can be also obtained in the seventh embodiment.

Eighth Embodiment

Figure 25:
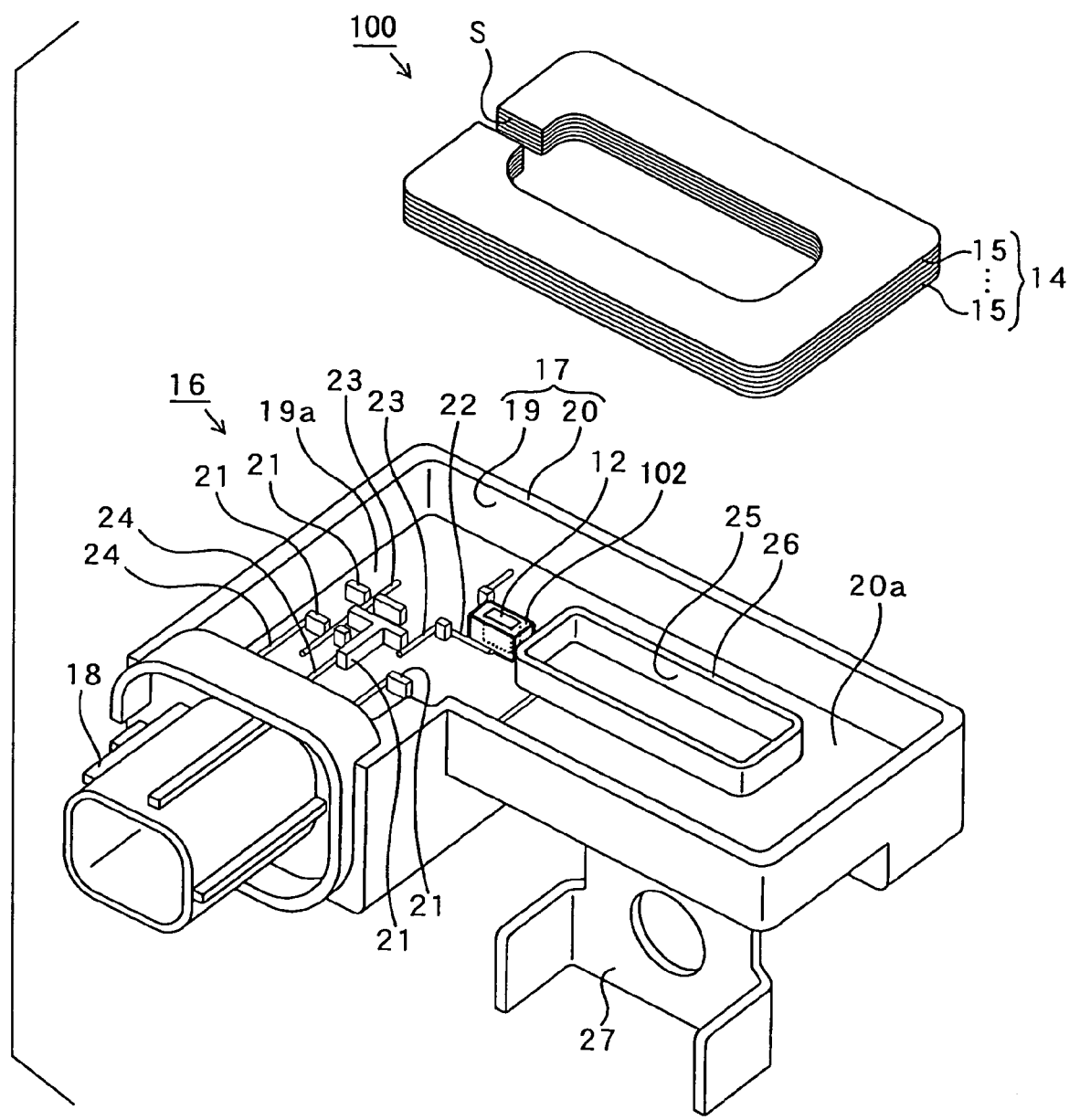
FIG. 25 is an exploded perspective view showing an electric current sensor according to an eighth embodiment of the present invention.

FIG. 25 is an exploded perspective view of a main portion for explaining the schematic construction of an electric current sensor 100 according to an eighth embodiment of the present invention.

Figure 26:
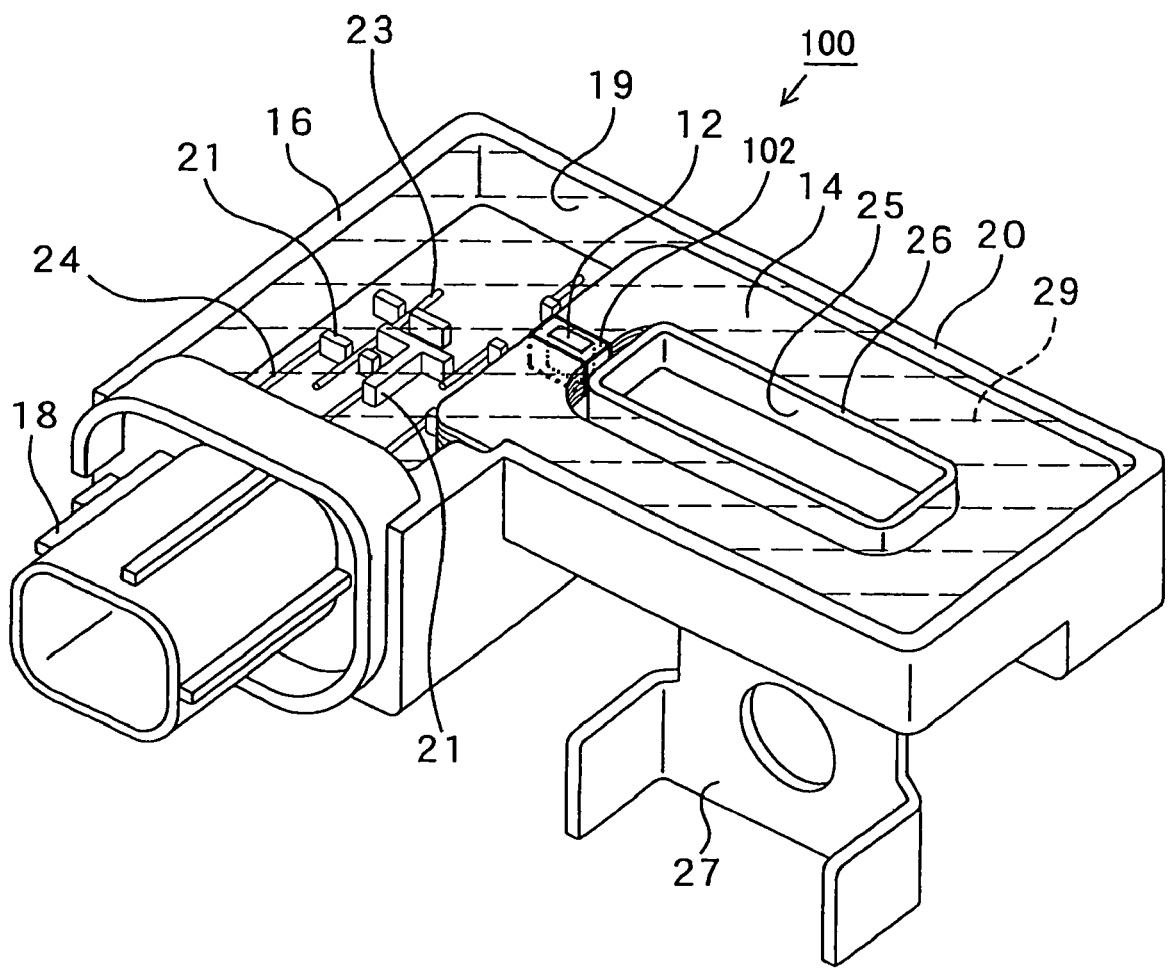
FIG. 26 is a perspective view showing the sensor according to the eighth embodiment.

FIG. 26 is a perspective view of the electric current sensor 100.

Figure 27:
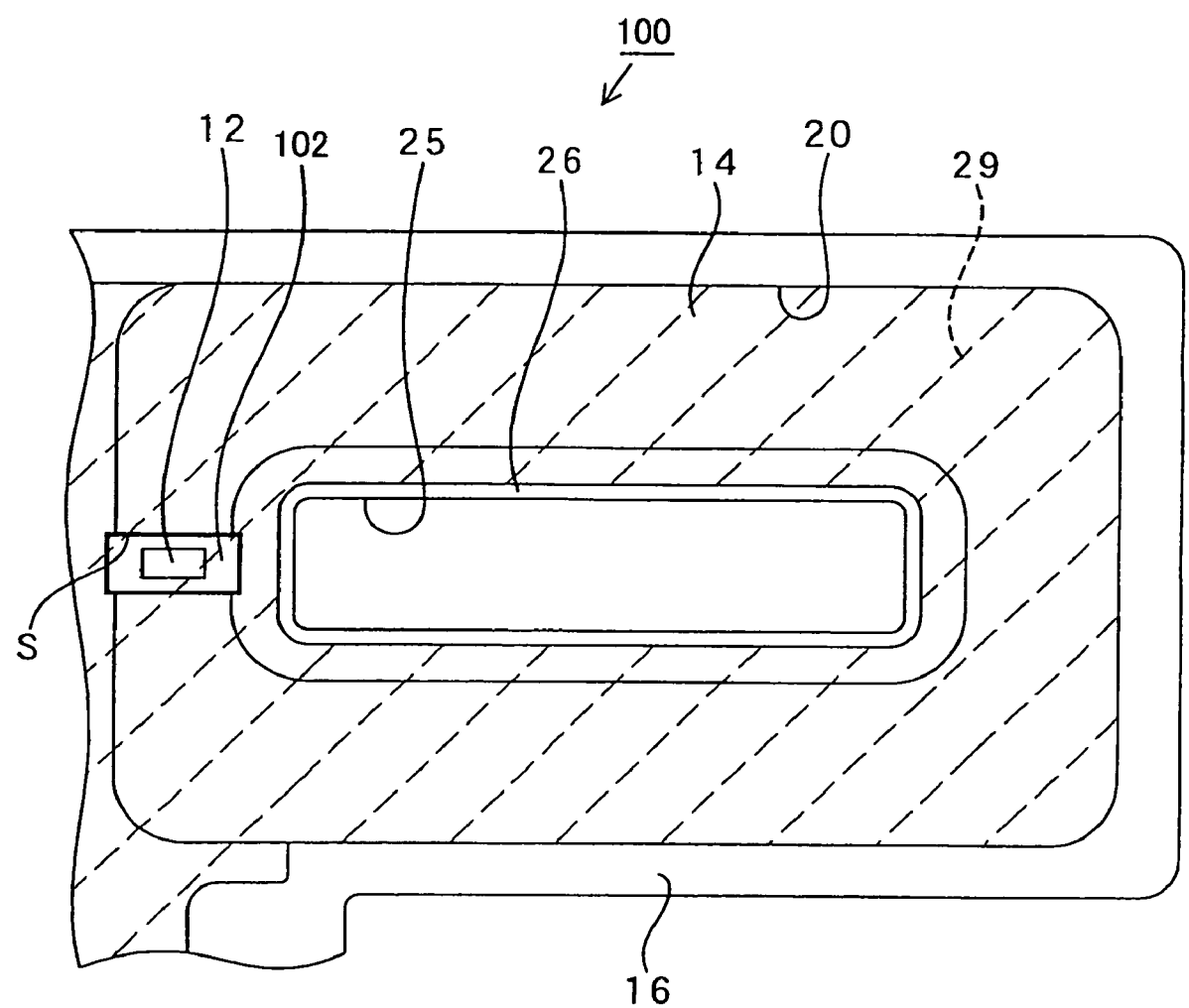
FIG. 27 is a partial plan view showing a main part of the sensor according to the eighth embodiment.

FIG. 27 is a plan view of a main portion of the electric current sensor 100.

The electric current sensor 100 of the eighth embodiment differs from the electric current sensor 80 of the sixth embodiment in that the regulating member 82 of the sixth embodiment is omitted and a regulating member 102 is arranged instead of the regulating member 82.

The regulating member 102 corresponds to the deformation preventing means.

Namely, the electric current sensor 100 is constructed by the Hall element 12, the core 14 (the core cutting piece 15 and the magnetic gap S), the box body 16 (the storing portion 17, the connector mounting portion 18, the circuit storing portion 19, the core storing portion 20, the insertion hole 25 and the outer circumferential wall 26), the electronic part 21, the wiring members 22 to 24, the attachment fitting 27, the sealant 29, the regulating member 102, etc.

The regulating member 102 rises on the bottom face 19a of the circuit storing portion 19 and is formed in a shape in which a through hole extends through the central portion so that an opening is formed in a rectangular shape. The Hall element 12 is fitted to the through hole of the regulating member 102, and the regulating member 102 surrounds the circumference of the Hall element 12. The arranging position and the size shape of the regulating member 102 are set so as to be nipped without any clearance in the magnetic gap S of the core 14 when the core 14 is stored into the storing portion 17. The regulating member 102 is constructed by a synthetic resin material of a nonmagnetic substance and is formed integrally with the box body 16 by injection molding.

Thus, in the eighth embodiment, the regulating member 102 is nipped without any clearance in the entire magnetic gap S of the core 14. Therefore, even when stress generated by hardening the sealant 29 is applied to the core 14, the deformation of the magnetic gap S is restrained by the regulating member 102 and no size shape of the magnetic gap S is changed from a set value.

In accordance with the eighth embodiment in which the regulating member 102 is nipped without any clearance in the entire magnetic gap S of the core 14, the deformation of the magnetic gap S can be more reliably restrained in comparison with the sixth embodiment and the seventh embodiment in which the regulating members 82, 92 are nipped in one portion of the magnetic gap S of the core 14. Therefore, the above operation and effect of the sixth embodiment can be further raised.

Such changes and modifications are to be understood as being within the scope of the present invention as defined by the appended claims.

What is claimed is:

1. An electric current sensor comprising:
   a core having a ring shape and including a plurality of core pieces, which are laminated and integrated to provide the core;
   a magnetic gap disposed on a predetermined part of the core;
   a Hall element disposed in the magnetic gap;
   a body for accommodating the core and the Hall element; and
   a seal member for sealing the core and the Hall element into the body, wherein
   each core piece has a thin plate shape,
   the core includes deformation preventing means for preventing a deformation of the magnetic gap,
   the magnetic gap is provided by a notch, which is disposed on an inner portion of the core, and
   the deformation preventing means is a connection portion for connecting the core at the notch.

2. The sensor according to claim 1, wherein the connection portion and the core are integrated.

3. The sensor according to claim 1, wherein:
   each core piece is made of electrically conductive magnetic material, and
   the ring shape of the core includes a rectangular shape, four corners of which are rounded.

4. An electric current sensor comprising:
   a core having a ring shape and including a plurality of core pieces, which are laminated and integrated to provide the core;
   a magnetic gap disposed on a predetermined part of the core;
   a Hall element disposed in the magnetic gap;
   a body for accommodating the core and the Hall element; and
   a seal member for sealing the core and the Hall element into the body, wherein
   each core piece has a thin plate shape,
   the core includes deformation preventing means for preventing a deformation of the magnetic gap,
   the magnetic gap is provided by a notch, which is disposed on an outer portion of the core, and
   the deformation preventing means is a connection portion for connecting the core at the notch.

5. The sensor according to claim 4, wherein the connection portion and the core are integrated.

6. The sensor according to claim 4, wherein:
   each core piece is made of electrically conductive magnetic material, and
   the ring shape of the core includes a rectangular shape, four corners of which are rounded.

7. An electric current sensor comprising:
a core having a ring shape and including a plurality of core pieces, which are laminated and integrated to provide the core;
a magnetic gap disposed on a predetermined part of the core;
a Hall element disposed in the magnetic gap;
a body for accommodating the core and the Hall element; and
a seal member for sealing the core and the Hall element into the body, wherein
each core piece has a thin plate shape,
the core includes deformation preventing means for preventing a deformation of the magnetic gap,
the magnetic gap is provided by a through-hole, which is disposed on a middle portion of the core, and
the deformation preventing means is a connection portion for connecting the core at the through-hole.

8. The sensor according to claim 7, wherein the connection portion and the core are integrated.

9. The sensor according to claim 7, wherein:
each core piece is made of electrically conductive magnetic material, and
the ring shape of the core includes a rectangular shape, four corners of which are rounded.

* * * * *